US011211536B2

(12) United States Patent
Wu et al.

(10) Patent No.: US 11,211,536 B2
(45) Date of Patent: Dec. 28, 2021

(54) SEMICONDUCTOR DEVICE PACKAGE AND A METHOD OF MANUFACTURING THE SAME

(71) Applicant: Advanced Semiconductor Engineering, Inc., Kaohsiung (TW)

(72) Inventors: Mei-Yi Wu, Kaohsiung (TW); Lu-Ming Lai, Kaohsiung (TW); Yu-Ying Lee, Kaohsiung (TW); Yung-Yi Chang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/862,447

(22) Filed: Apr. 29, 2020

(65) Prior Publication Data

US 2020/0259058 A1    Aug. 13, 2020

Related U.S. Application Data

(63) Continuation of application No. 15/860,567, filed on Jan. 2, 2018, now Pat. No. 10,665,765.

(Continued)

(51) Int. Cl.
*H01L 33/62* (2010.01)
*H01L 33/48* (2010.01)
(Continued)

(52) U.S. Cl.
CPC .......... *H01L 33/62* (2013.01); *B81C 1/00269* (2013.01); *H01L 33/483* (2013.01);
(Continued)

(58) Field of Classification Search
None
See application file for complete search history.

(56) References Cited

U.S. PATENT DOCUMENTS 7,816,697 B1 * 10/2010 Spurlock ................. H01L 33/58
257/98
8,269,298 B2    9/2012 Nagamatsu et al.
(Continued)

FOREIGN PATENT DOCUMENTS

CN         101853846 A    10/2010

OTHER PUBLICATIONS

Office Action for corresponding Chinese Patent Application No. 201810116785.7, dated Oct. 29, 2020, 8 pages.
(Continued)

*Primary Examiner* — Benjamin P Sandvik
(74) *Attorney, Agent, or Firm* — Foley & Lardner LLP

(57) ABSTRACT

A semiconductor device package includes a carrier, a semiconductor device, a lid, a conductive post, a first patterned conductive layer, a conductive element disposed between the first conductive post and the first patterned conductive layer, and an adhesive layer disposed between the lid and the carrier. The conductive post is electrically connected to the first patterned conductive layer. The semiconductor device is electrically connected to the first patterned conductive layer. The lid is disposed on the carrier, and the lid includes a second patterned conductive layer electrically connected to the first conductive post.

2 Claims, 25 Drawing Sheets

Related U.S. Application Data

(60) Provisional application No. 62/457,737, filed on Feb. 10, 2017.

(51) Int. Cl.
  *B81C 1/00* (2006.01)
  *B81B 7/00* (2006.01)
  *H01L 33/60* (2010.01)

(52) U.S. Cl.
  CPC .............. *B81B 7/007* (2013.01); *H01L 33/60* (2013.01); *H01L 2224/48091* (2013.01); *H01L 2933/0066* (2013.01)

(56) References Cited

U.S. PATENT DOCUMENTS

| | | | |
|---|---|---|---|
| 9,029,962 | B1 | 5/2015 | Dreiza et al. |
| 2001/0054758 | A1 | 12/2001 | Isaak |
| 2005/0167795 | A1 | 8/2005 | Higashi |
| 2006/0279949 | A1 | 12/2006 | Shin et al. |
| 2007/0295969 | A1 | 12/2007 | Chew et al. |
| 2009/0140413 | A1 | 6/2009 | Wang et al. |
| 2009/0242923 | A1 | 10/2009 | Goodrich |
| 2013/0181314 | A1 | 7/2013 | Ryu et al. |
| 2013/0187260 | A1* | 7/2013 | Kelkar ................ H01L 23/4951 257/676 |
| 2017/0073221 | A1 | 3/2017 | Huang et al. |
| 2017/0353004 | A1* | 12/2017 | Chen ................... H01S 5/06825 |
| 2018/0069163 | A1 | 3/2018 | Clark et al. |
| 2019/0376667 | A1* | 12/2019 | Coffy .................... F21V 19/003 |
| 2019/0376676 | A1* | 12/2019 | Hannan ............... H01S 5/02257 |
| 2020/0227597 | A1* | 7/2020 | Chu ........................ G01V 8/10 |

OTHER PUBLICATIONS

Search Report for corresponding Chinese Patent Application No. 201810116785.7, dated Oct. 29, 2020, 4 pages (with English translation).

Final Office Action for U.S. Appl. No. 15/860,567 dated Feb. 20, 2019, 15 pages.

Non-Final Office Action for U.S. Appl. No. 15/860,567 dated Sep. 26, 2019, 12 pages.

Non-Final Office Action for U.S. Appl. No. 15/860,567, dated Sep. 11, 2018, 12 pages.

Notice of Allowance for U.S. Appl. No. 15/860,567 dated Jan. 22, 2020, 9 pages.

Office Action from corresponding Taiwan Patent Application No. 107104080, dated Feb. 19, 2021, 8 pages.

Search Report with English Translation from corresponding Taiwan Patent Application No. 107104080, dated Feb. 19, 2021, 2 pages.

Office Action from corresponding Taiwan Patent Application No. 107104080, dated Aug. 24, 2021, 8 pages.

Search Report with English Translation from corresponding Taiwan Patent Application No. 107104080, dated Aug. 24, 2021, 2 pages.

* cited by examiner

SEMICONDUCTOR DEVICE PACKAGE AND A METHOD OF MANUFACTURING THE SAME

CROSS-REFERENCE TO RELATED APPLICATION

This application is a continuation of U.S. application Ser. No. 15/860,567, filed Jan. 2, 2018, which claims the benefit of and priority to U.S. Provisional Application No. 62/457,737, filed Feb. 10, 2017, the contents of all such applications being incorporated herein by reference in their entirety.

BACKGROUND

1. Technical Field

The present disclosure relates to a semiconductor device package, and to a semiconductor device package including a carrier with a patterned conductive layer and a lid with a patterned conductive layer, the patterned conductive layer of the carrier and the patterned conductive layer of the lid forming an electrical loop.

2. Description of the Related Art

In an optical device package, a light source is disposed on a carrier and a transparent lid is attached to the carrier to cover the light source. To prevent light of the light source from directly shining in someone's eyes should the transparent lid be detached from the carrier, an additional opaque lid may be used to secure the transparent lid to the carrier. However, including the opaque lid may increase a cost of the optical device package. Moreover, the opaque lid may adversely affect performance of the optical device package (e.g. an area of the transparent lid through which light passes may be decreased). Further, the opaque lid may increase a size/dimensions of the optical device package.

SUMMARY

In some embodiments, according to one aspect, a semiconductor device package includes a carrier, a semiconductor device, a lid, a conductive element, and an adhesive layer disposed between the lid and the carrier. The carrier includes a first patterned conductive layer and a first conductive post electrically connected to the first patterned conductive layer. The conductive element is disposed between the first conductive post and the first patterned conductive layer. The semiconductor device is electrically connected to the first patterned conductive layer. The lid is disposed on the carrier, and the lid includes a second patterned conductive layer electrically connected to the first conductive post.

In some embodiments, according to another aspect, a semiconductor device package includes a carrier including a patterned conductive layer, a light source disposed on the carrier, and a lid disposed on the carrier. The light source is electrically connected to the patterned conductive layer. The lid covers the light source and includes a conductive trace. The patterned conductive layer and the conductive trace constitute at least a portion of an electric circuit.

DETAILED DESCRIPTION

Figure 1A:
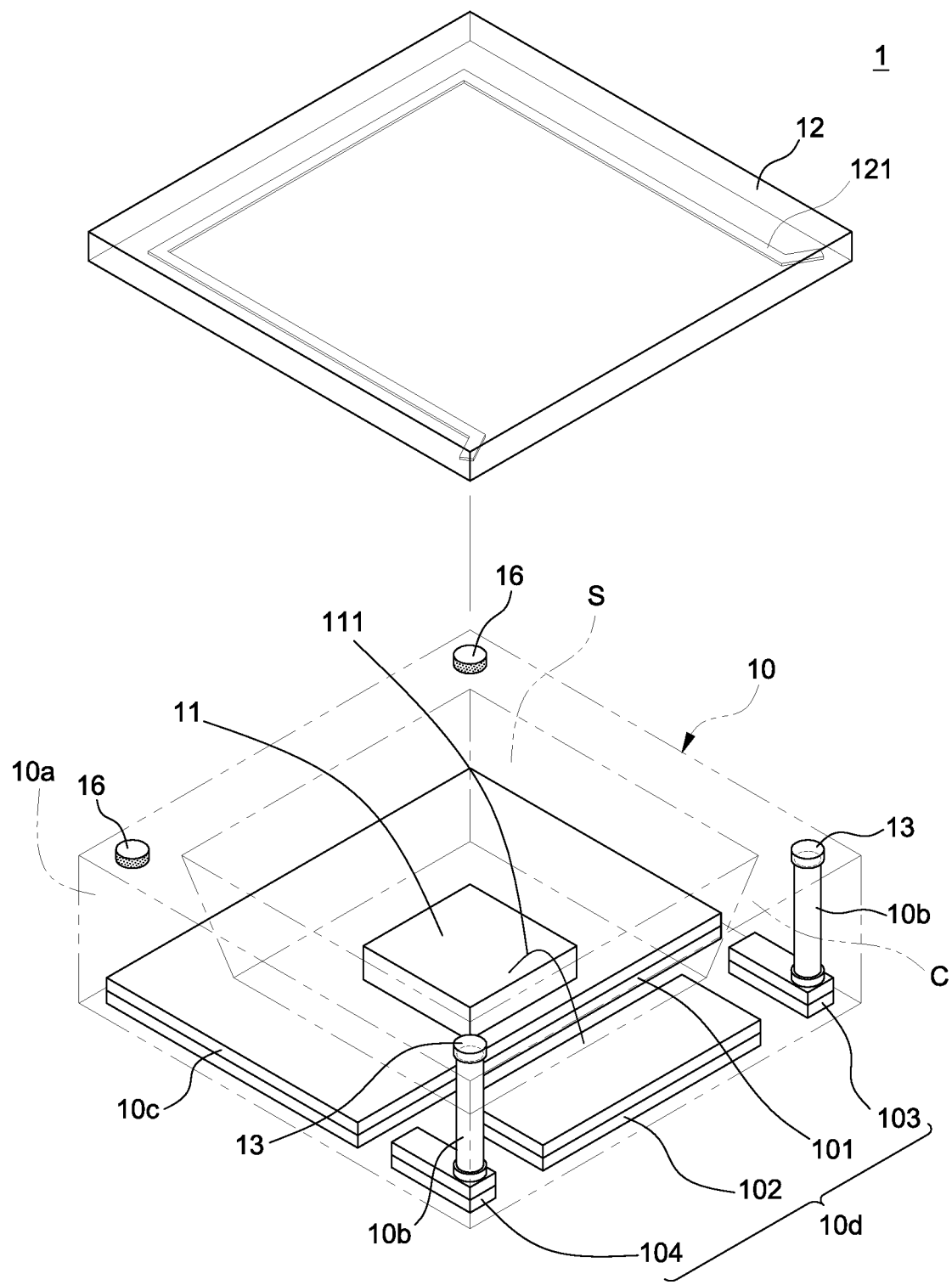
FIG. 1A illustrates a perspective view of a semiconductor device package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1A is a perspective view of a semiconductor device package 1 in accordance with some embodiments of the present disclosure. The semiconductor device package 1 includes a carrier 10, a semiconductor device 11, a conductive element 13, an adhesive material 16, and a lid 12.

The carrier 10 includes an encapsulant 10a, a conductive post 10b, a conductive layer 10c, and a patterned conductive layer 10d. The encapsulant 10a may include a molding compound, a ceramic material, or other suitable materials. The encapsulant 10a encapsulates the conductive post 10b, the conductive layer 10c, and the patterned conductive layer 10d. The encapsulant 10a defines an accommodating space (S). The conductive post 10b extends between the conductive element 13 and the patterned conductive layer 10d. The conductive post 10b may be a solid cylindrical post, a solid square post, or a solid post with a suitable shape. The conductive layer 10c is disposed on the patterned conductive layer 10d. In some embodiments, the conductive layer 10c is a patterned conductive layer. The conductive layer 10c may include a pyrolized photoresist film (PPF), silver (Ag), another conductive metal, or an alloy thereof. The conductive layer 10c may facilitate reflection of light. The patterned conductive layer 10d may be a leadframe or a substrate. The patterned conductive layer 10d may be a pre-molded leadframe. The patterned conductive layer 10d includes conductive pads 101, 102, 103, and 104. The pads 103 and 104 are respectively disposed adjacent to and on opposite sides of the pad 102. The conductive post 10b is disposed on and electrically connected to the pad 103 via the conductive layer 10c. The conductive post 10b is disposed on and electrically connected to the pad 104 via the conductive layer 10c. The pad 101 is electrically connected to the pad 102. The pad 101 may be a cathode. The pad 102 may be an anode. The pad 101 and the pad 102 may have opposite electrical polarities. The pads 103 and 104 are configured to be electrically connected to an external device. The external device may be a driver, a controller, or a detector.

The semiconductor device 11 includes, or is connected to, a conductive wire 111 electrically bonded to an active surface of the semiconductor device 11. The semiconductor device 11 is disposed in the accommodating space (S). The semiconductor device 11 is disposed on the conductive layer 10c via an adhesive (not denoted in FIG. 1A). The semiconductor device 11 may be electrically connected to the pad 101 via a conductive adhesive (not denoted in FIG. 1A). The semiconductor device 11 is electrically connected to the pad 102 via the conductive wire 111. The semiconductor device 11 may include, for example, a microelectromechanical system (MEMS) package, a MEMS microphone, a MEMS, a MEMS press sensor, or a MEMS gas sensor. The semiconductor device 11 may include a light emitting device or a light source, such as a vertical-cavity surface-emitting laser (VCSEL). In some embodiments, two or more semiconductor devices 11 may be implemented. Two or more semiconductor devices 11 may be disposed on the pad 101 and electrically connected to the pad 102.

The conductive element 13 and the adhesive material 16 are disposed between the carrier 10 and the lid 12. The conductive element 13 includes a conductive material. The conductive element 13 may be a conductive adhesive, a solder material, or other suitable conductive materials. The adhesive material 16 may include a non-conductive material. In some embodiments, the adhesive material 16 may be omitted.

The lid 12 covers the carrier 10 and the semiconductor device 11. The lid 12 includes a patterned conductive layer (or a conductive trace) 121. The patterned conductive layer 121 is disposed on a lower surface of the lid 12 (e.g. facing the carrier 10). The patterned conductive layer 121 is electrically connected to the pads 103 and 104 via the conductive posts 10b and the conductive elements 13. The pads 103 and 104 of the patterned conductive layer 10d, the conductive layer 10c, the conductive posts 10b, the conductive element 13, and the patterned conductive layer 121 constitute at least part of an electric circuit, and may constitute an open circuit. The lid 12 may include a transparent material (e.g. having a transmittance of about 80% or more, or about 90% or more for light emitted by, or detected by, the semiconductor device 11) or an opaque material (e.g.

having a transmittance of about 20% or less, or about 10% or less for light emitted by, or detected by, the semiconductor device 11). The lid 12 may include a conductive material or a dielectric material. In some embodiments, the lid may include a glass, a transparent metal (e.g. an indium-tin-oxide (ITO) or an indium-zinc-oxide (IZO)), or a plastic. The lid 12 and the carrier 10 define a channel (C) in fluid/air communication with the accommodating space (S). The lid 12, the conductive element 13, and the carrier 10 define the channel (C) in fluid/air communication with the accommodating space (S). In some embodiments, the patterned conductive layer 121 may be embedded in and exposed by the lower surface of the lid 12.

Figure 1B:
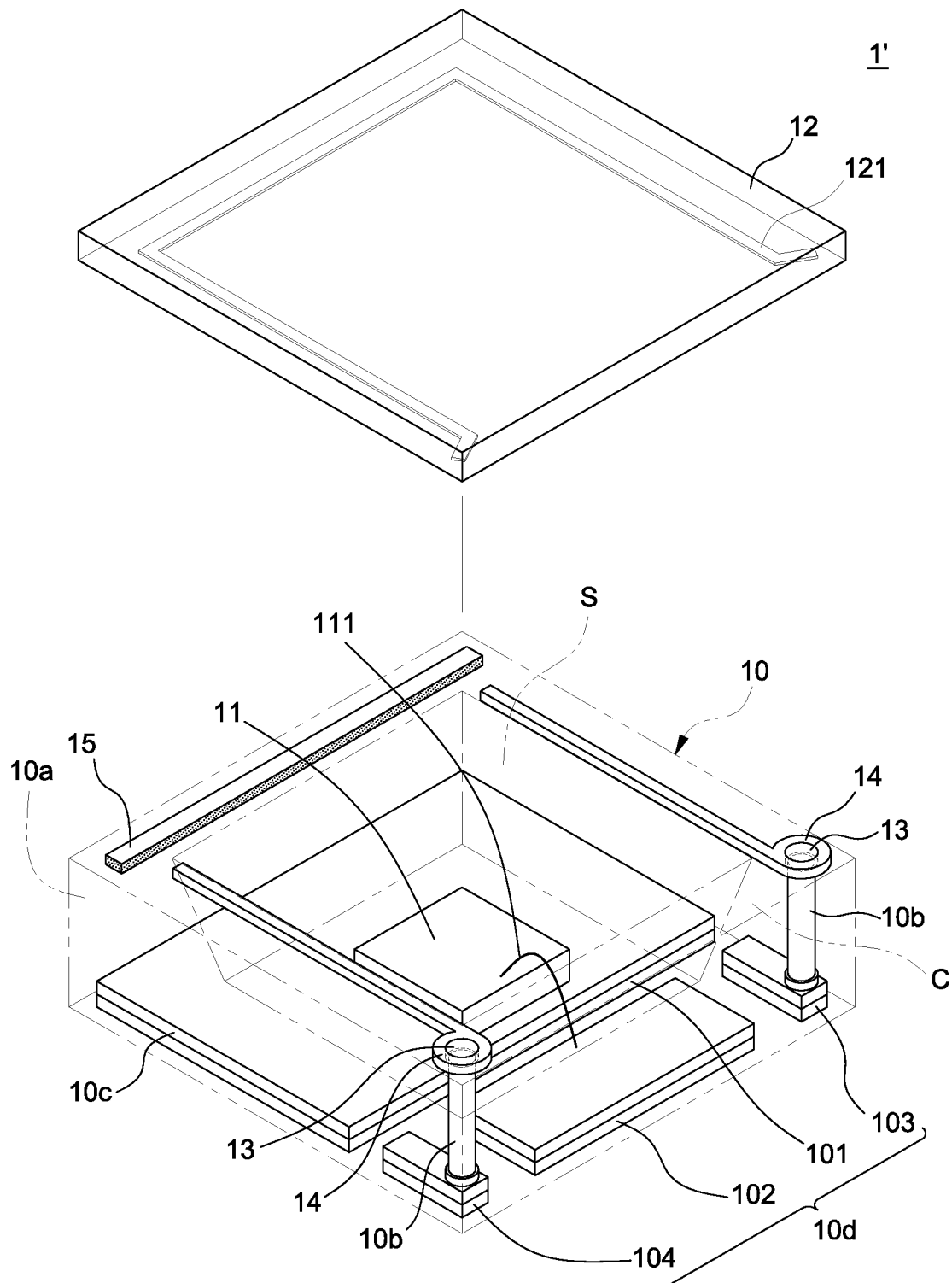
FIG. 1B illustrates a perspective view of a semiconductor device package according to some embodiments of the present disclosure.

FIG. 1B is a perspective view of a semiconductor device package 1' in accordance with some embodiments of the present disclosure. The semiconductor device package 1' of FIG. 1B is similar to the semiconductor device package 1 of FIG. 1A, except that an adhesive layer 14 and an adhesive layer 15 (which may replace the adhesive material 16) are disposed on the carrier 10.

The adhesive layer 14 is disposed on two opposite sides of the carrier 10. The adhesive layer 14 is adjacent to one or more of the conductive elements 13. The adhesive layer 14 may contact one or more of the conductive elements 13. The adhesive layer 14 may be spaced from one or more of the conductive elements 13. The adhesive layer 14 surrounds one or more of the conductive elements 13. The adhesive layer 14 may partially cover one or more of the conductive elements 13. The adhesive layer 14 may horizontally extend from one or more of the pads 103/104 to the pad 101, and may be disposed above one or more of the pads 103/104 and the pad 101. The adhesive layer 14 includes a conductive material. The material of the adhesive layer 14 may be the same as the material of the conductive element 13. The adhesive layer 14 is electrically connected to the patterned conductive layer 121. The adhesive layer 14 is electrically connected to the conductive posts 10b. A size (e.g. a length, a width, and/or a thickness) of the adhesive layer 14 may be flexibly set according to design specifications. The adhesive layer 14 may include two portions respectively disposed on the two opposite sides of the carrier 10, and the portions may be discontinuous. The portions may be separated or isolated. The portions of the adhesive layer 14 define a gap.

The adhesive layer 15 is disposed on one side of the carrier 10. The adhesive layer 15 may horizontally extend from the pad 103/104 to the pad 101, and may be disposed above the pad 103/104 and the pad 101. The adhesive layer 15 may be spaced from the adhesive layer 14. The adhesive layer 15 may contact the adhesive layer 14. A size (e.g. a length, a width, and/or a thickness) of the adhesive layer 15 may be flexibly set according to design specifications. A bonding force of the adhesive layer 15 between the carrier 10 and the lid 12 is greater than the bonding force of the adhesive layer 14 between the carrier 10 and the lid 12 (e.g. by a factor of about 1.1 or more, by a factor of about 1.2 or more, or by a factor of about 1.3 or more). The lid 12 is secured to the carrier 10 via the conductive element 13, the adhesive layer 14, and the adhesive layer 15. In some embodiments, the adhesive layer 15 may be omitted, or replaced by the adhesive layer 14.

Figure 1C:
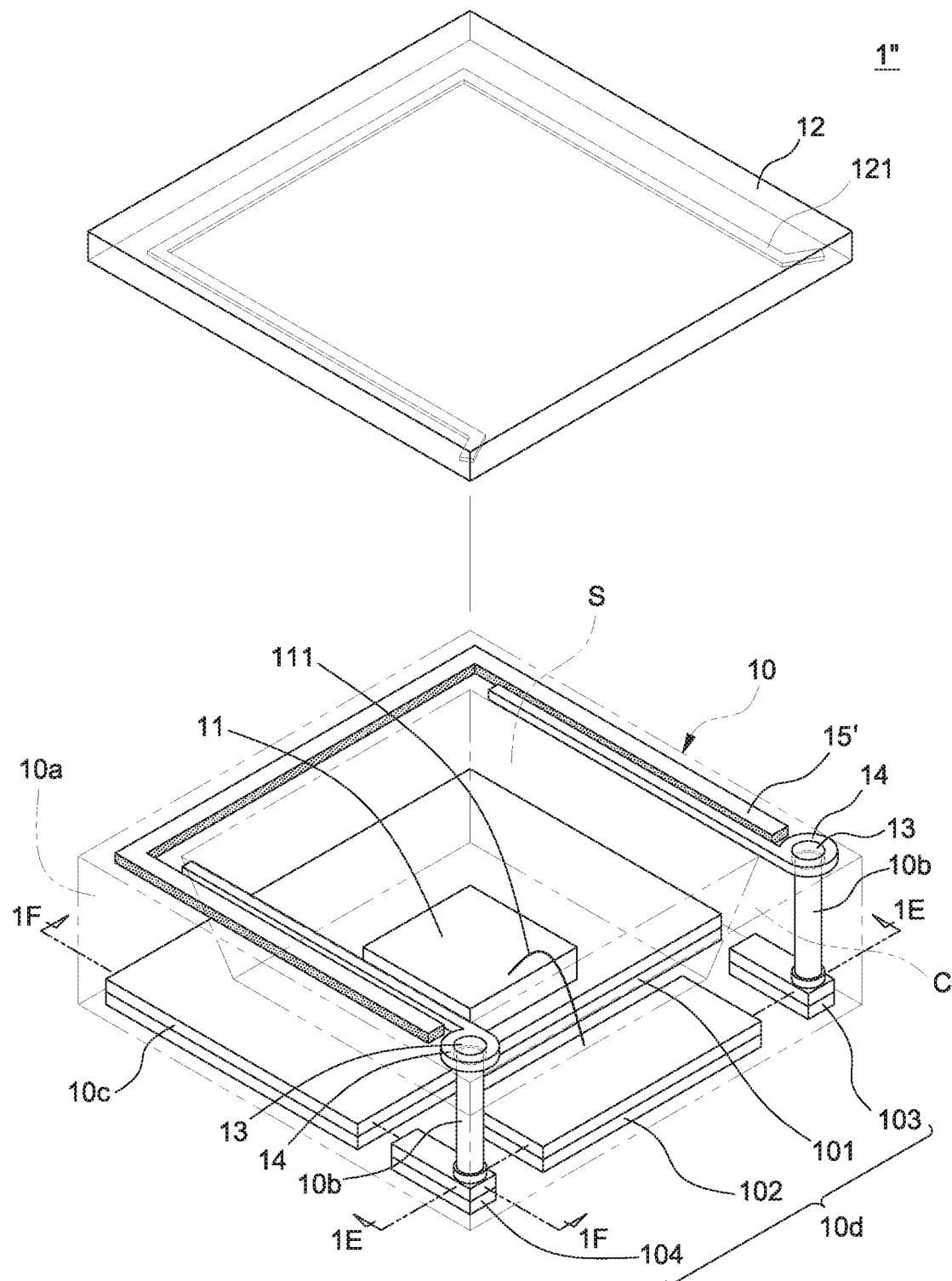
FIG. 1C illustrates a perspective view of a semiconductor device package according to some embodiments of the present disclosure.

FIG. 1C is a perspective view of a semiconductor device package 1" in accordance with some embodiments of the present disclosure. The semiconductor device package 1" of FIG. 1C is similar to the semiconductor device package 1' of FIG. 1B, except that an adhesive layer 15' partially surrounds the adhesive layer 14. The adhesive layer 15' surrounds the semiconductor device 11. The adhesive layer 15' may be adjacent to the adhesive layer 14. The adhesive layer 15' may be spaced from the adhesive layer 14. The adhesive layer 15' may contact the adhesive layer 14. The adhesive layer 15' may extend along three sides of the carrier 10, which can provide for the lid 12 being attached to the carrier 10 securely.

Figure 1D:
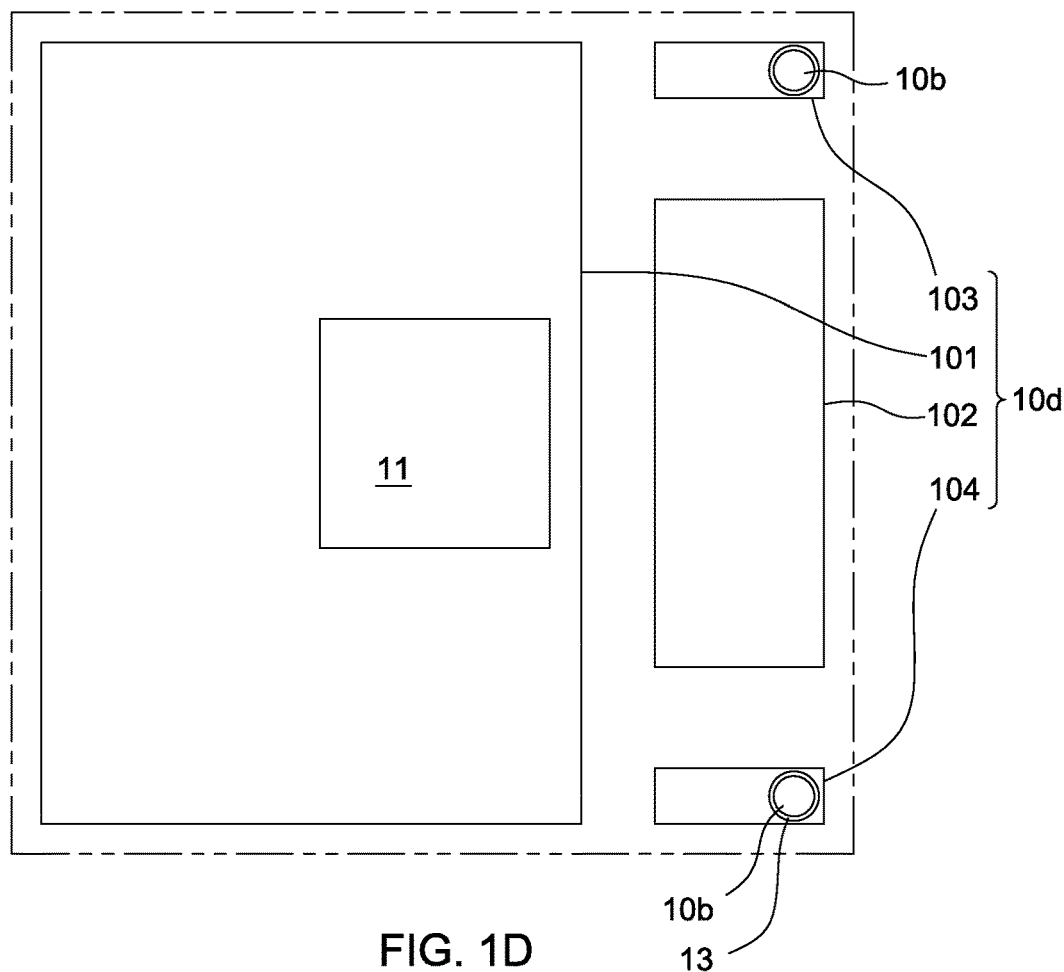
FIG. 1D illustrates a layout of a semiconductor device package according to some embodiments of the present disclosure.

FIG. 1D is a layout corresponding to the semiconductor device packages 1/1'/1" according to some embodiments of the present disclosure. The patterned conductive layer 10d may be a leadframe. The patterned conductive layer 10d may be electrically connected to a system board (e.g. a printed circuit board (PCB)). The patterned conductive layer 10d includes the conductive pads 101, 102, 103, and 104. Two conductive posts 10b are respectively disposed on the pads 103 and 104. The pad 101 is electrically connected to the pad 102. The pads 103 and 104 are electrically isolated from the pads 101 and 102.

Figure 1E:
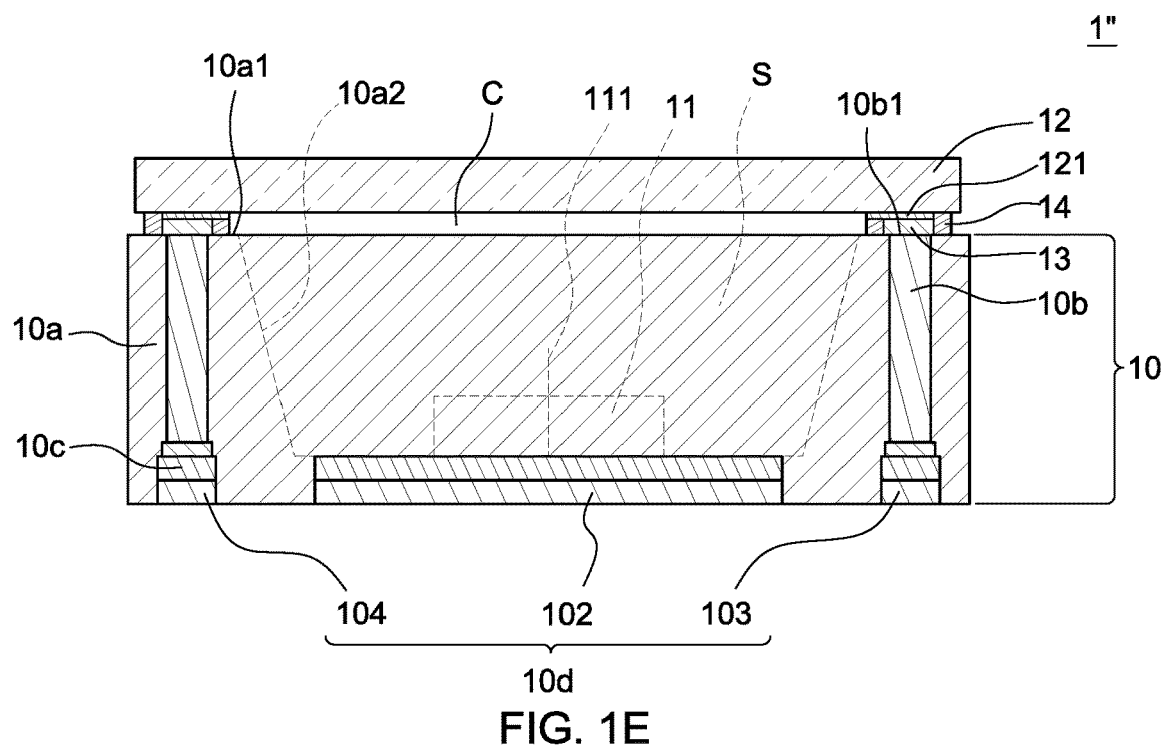
FIG. 1E illustrates a cross-sectional view of a semiconductor device package according to some embodiments of the present disclosure.

FIG. 1E is a cross-sectional view of the semiconductor device package 1" across line 1E in FIG. 1C according to some embodiments of the present disclosure. The conductive element 13 and the adhesive layer 14 are disposed between the carrier 10 and the lid 12. The lid 12 is attached on the carrier 10 via the conductive element 13 and the adhesive layer 14. The patterned conductive layer 121 is electrically connected to the conductive element 13.

The carrier 10 has an upper surface 10a1 and a side surface 10a2. The side surface 10a2 has a slope. The accommodating space (S) is defined by the side surface 10a2. The accommodating space (S) may increase in area in a direction towards the lid 12. The conductive post 10b has an upper surface 10b1. The upper surface 10a1 of the encapsulant 10a and the upper surface 10b1 of the conductive post 10b are substantially coplanar.

The conductive element 13 is disposed on the carrier 10. The conductive element 13 is disposed between the patterned conductive layer 121 and the conductive post 10b. The conductive element 13 is surrounded by the adhesive layer 14. The patterned conductive layer 121 is surrounded by the adhesive layer 14. The patterned conductive layer 121 is covered by the adhesive layer 14. The patterned conductive layer 121 is electrically connected to the conductive posts 10b. The pad 103 is electrically connected to the pad 104 via the patterned conductive layer 121 and the conductive posts 10b. The pads 103 and 104 of the patterned conductive layer 10d and the patterned conductive layer 121 constitute at least part of an electric circuit, and may constitute an open circuit. The pads 103 and 104 of the patterned conductive layer 10d, the conductive layer 10c, the conductive posts 10b, and the patterned conductive layer 121 constitute at least part of an electric circuit, and may constitute an open circuit. The pads 103 and 104 are electrically connected to an external device. Once the lid 12 is detached from the carrier 10, a short circuit occurs (e.g. between the pad 103 and the pad 104). When the short circuit is detected by the external device, the power of the semiconductor device 11 may be cut off. Accordingly, if the semiconductor device 11 is a light emitting device, the semiconductor device 11 would stop operating, thus avoiding shining light directly in to a person's eyes (e.g. a person who removed the lid 12), or avoiding light pollution or emission of light that is otherwise undesirable.

Figure 1F:
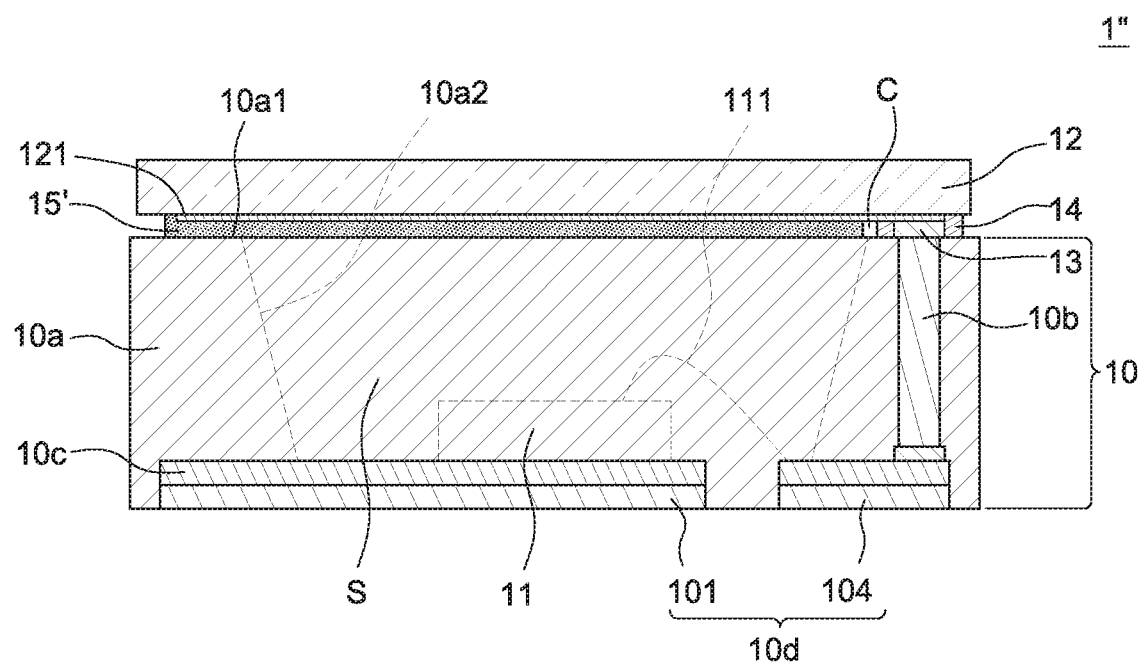
FIG. 1F illustrates a cross-sectional view of a semiconductor device package according to some embodiments of the present disclosure.

FIG. 1F is a cross-sectional view of the semiconductor device package 1" across the line 1F in FIG. 1C according to some embodiments of the present disclosure. The patterned conductive layer 121 is surrounded by the adhesive layer 15'. The patterned conductive layer 121 is covered by the adhesive layer 15'. The adhesive layer 15' is disposed between the carrier 10 and the lid 12. The lid 12 is attached on the carrier 10 via the adhesive layer 15'.

The channel (C) defined by the carrier 10 and the lid 12 may be used as an air or liquid venting channel to fluidly release vapor or moisture. The channel (C) can help to prevent a pop-corn effect (e.g. expansion that may lead to undesired separation of components) during a thermal cycle in an operation of manufacturing the semiconductor device package.

Figure 2A:
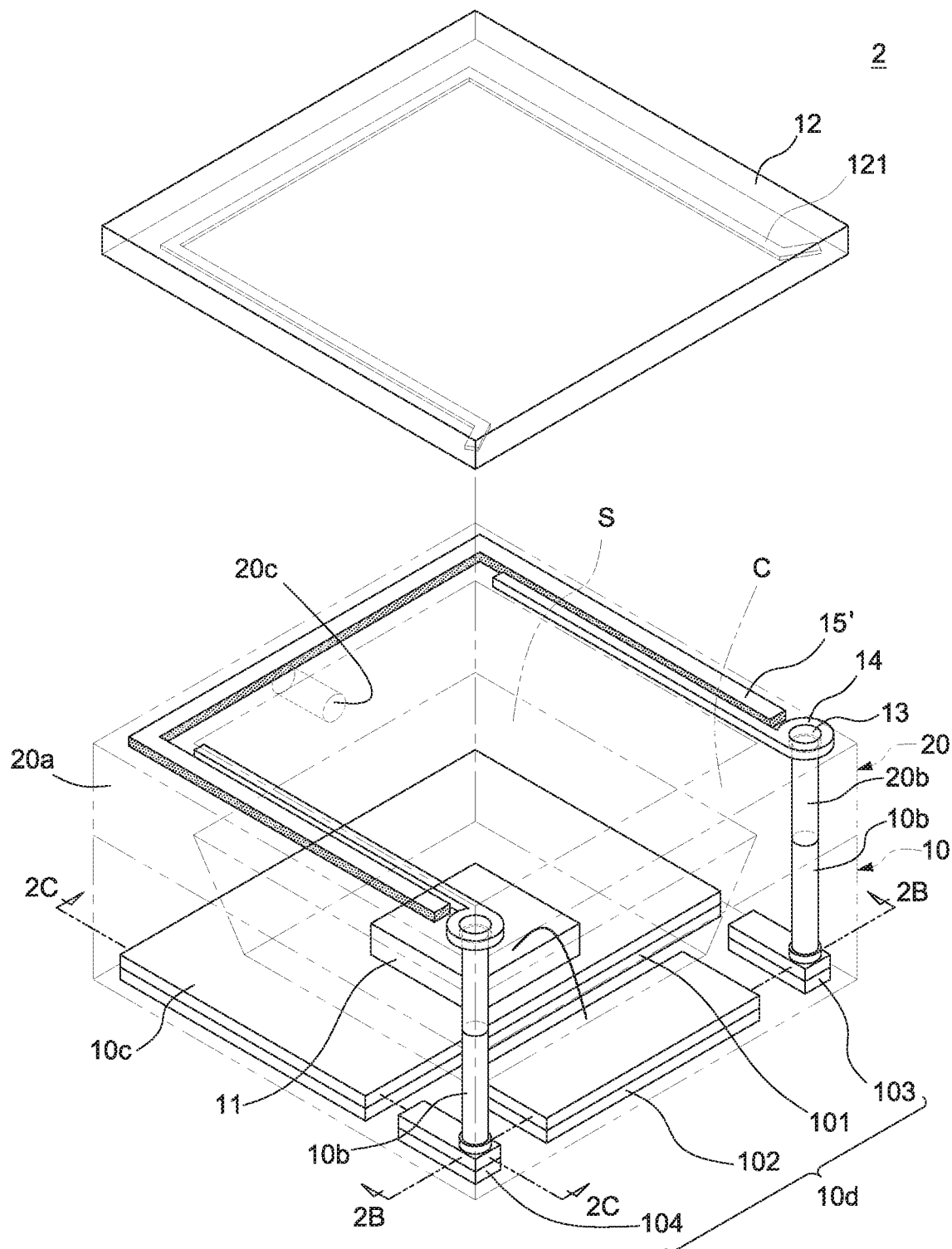
FIG. 2A illustrates a perspective view of a semiconductor device package according to some embodiments of the present disclosure.

FIG. 2A is a perspective view of a semiconductor device package 2 in accordance with some embodiments of the present disclosure. The semiconductor device package 2 of FIG. 2A is similar to the semiconductor device package 1" of FIG. 1C except that a carrier 20 is disposed between the carrier 10 and the lid 12. The carrier 20 is attached to the carrier 10 via an adhesive (not denoted in FIG. 2A). A height of the carrier 20 may be set according to design specifications.

The carrier 20 includes an encapsulant 20a, a conductive post 20b, and defines a through hole 20c. The encapsulant 20a may include a molding compound, a ceramic material, or other suitable materials. The encapsulant 20a encapsulates the conductive post 20b. The encapsulant 10a and the encapsulant 20a define the accommodating space (S). The conductive post 20b extends between the conductive element 13 and the carrier 10. The conductive post 20b aligns with the conductive post 10b. The conductive post 20b may be a solid cylindrical post, a solid square post, or a solid post with a suitable shape. The shape of the conductive post 20b may be the same as the shape of the conductive post 10b. The shape of the conductive post 20b may be different from the shape of the conductive post 10b. The through hole 20c is disposed on one side wall of the carrier 20, such as on a side wall opposite to a side wall adjacent to which the conductive posts 10b and 20b are disposed. In some embodiments, one or more through holes 20c may be disposed on one or more other side walls of the carrier 20. The through hole 20c is in fluid/air communication with the accommodating space (S). The through hole 20c may be used as an air venting hole to fluidly release vapor or moisture. The through hole 20c can help to prevent a pop-corn effect during a thermal cycle in an operation of manufacturing the semiconductor device package.

Figure 2B:
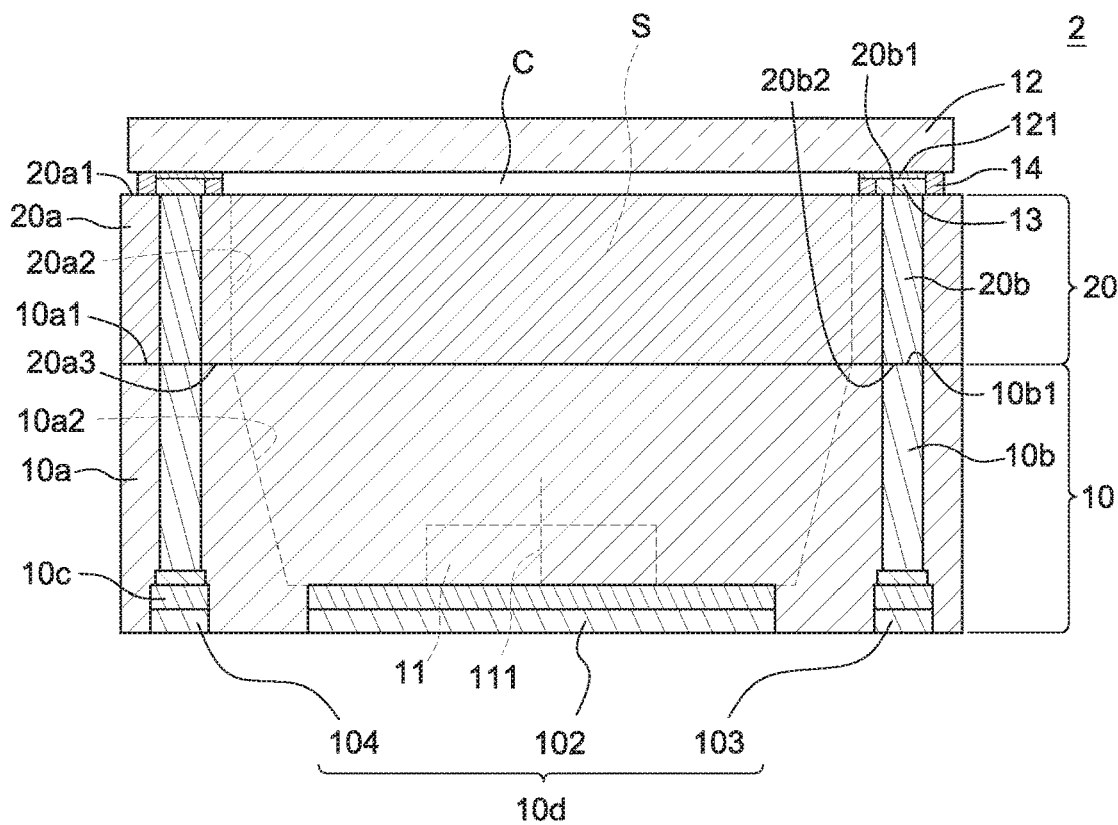
FIG. 2B illustrates a cross-sectional view of a semiconductor device package according to some embodiments of the present disclosure.

FIG. 2B is a cross-sectional view of the semiconductor device package 2 across line 2B in FIG. 2A according to some embodiments of the present disclosure. The material of the encapsulant 20a of the carrier 20 may be the same as the material of the encapsulant 10a of the carrier 10. The material of the encapsulant 20a of the carrier 20 may be different from the material of the encapsulant 10a of the carrier 10. The encapsulant 20a of the carrier 20 has an upper surface 20a1, a side surface 20a2, and a lower surface 20a3 opposite to the upper surface 20a1. The accommodating space (S) is defined by the side surface 10a2 of the carrier 10 and the side surface 20a2 of the carrier 20. The lower surface 20a3 of the carrier 20 may conform to the upper surface 10a1 of the carrier 10. The side surface 20a2 may have a slope. The side surface 20a2 may have a slope that is less than (e.g. is about 0.9 times or less, about 0.8 times or less, or about 0.7 times or less) a slope of the side surface 10a2.

The conductive post 20b of the carrier 20 has an upper surface 20b1 and a lower surface 20b2. The upper surface 20a1 of the encapsulant 20a and the upper surface 20b1 of the conductive post 20b are substantially coplanar. The lower surface 20b2 of the conductive post 20b contacts the upper surface 10b1 of the conductive post 10b.

The lid 20 and the carrier 20 define the channel (C). The lid 20, the adhesive layer 14, and the carrier 20 define the channel (C).

Figure 2C:
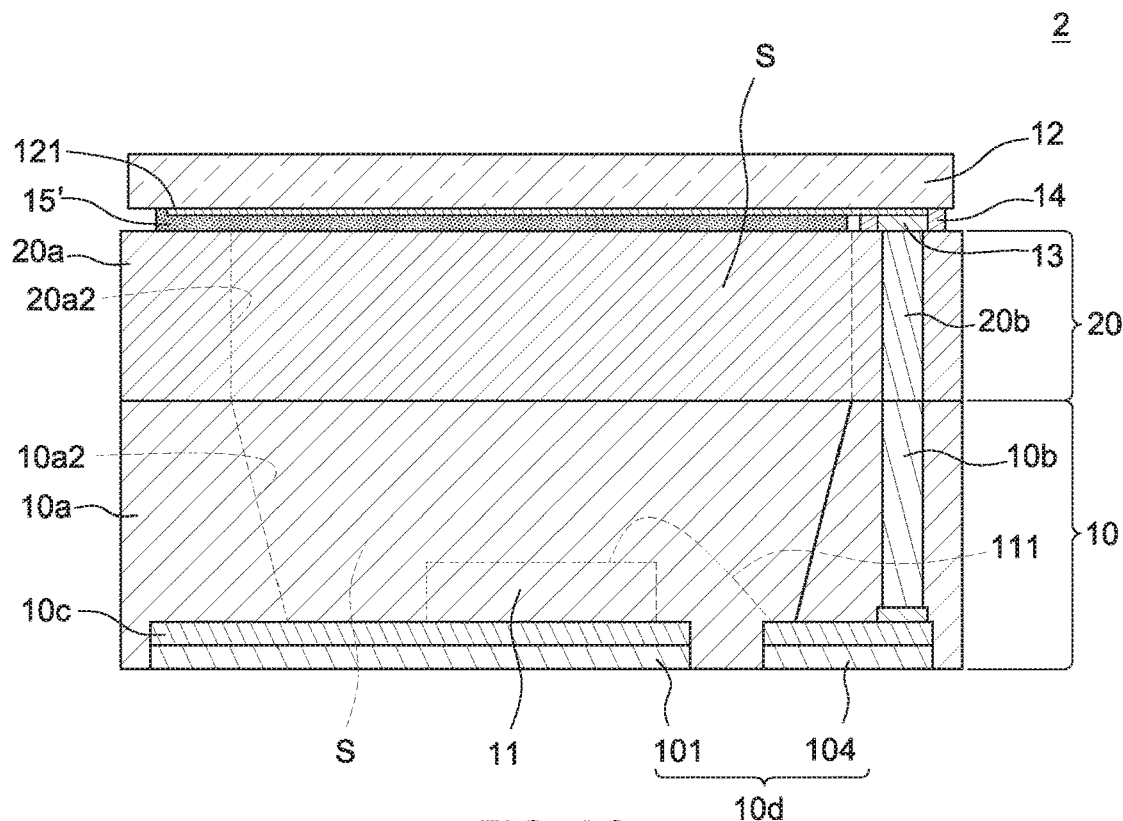
FIG. 2C illustrates a cross-sectional view of a semiconductor device package according to some embodiments of the present disclosure.

FIG. 2C is a cross-sectional view of the semiconductor device package 2 across line 2C in FIG. 2A according to some embodiments of the present disclosure. The patterned conductive layer 121 is surrounded by the adhesive layer 14 and the adhesive layer 15'. The patterned conductive layer 121 is covered by the adhesive layer 14 and the adhesive layer 15'.

Figure 3A:
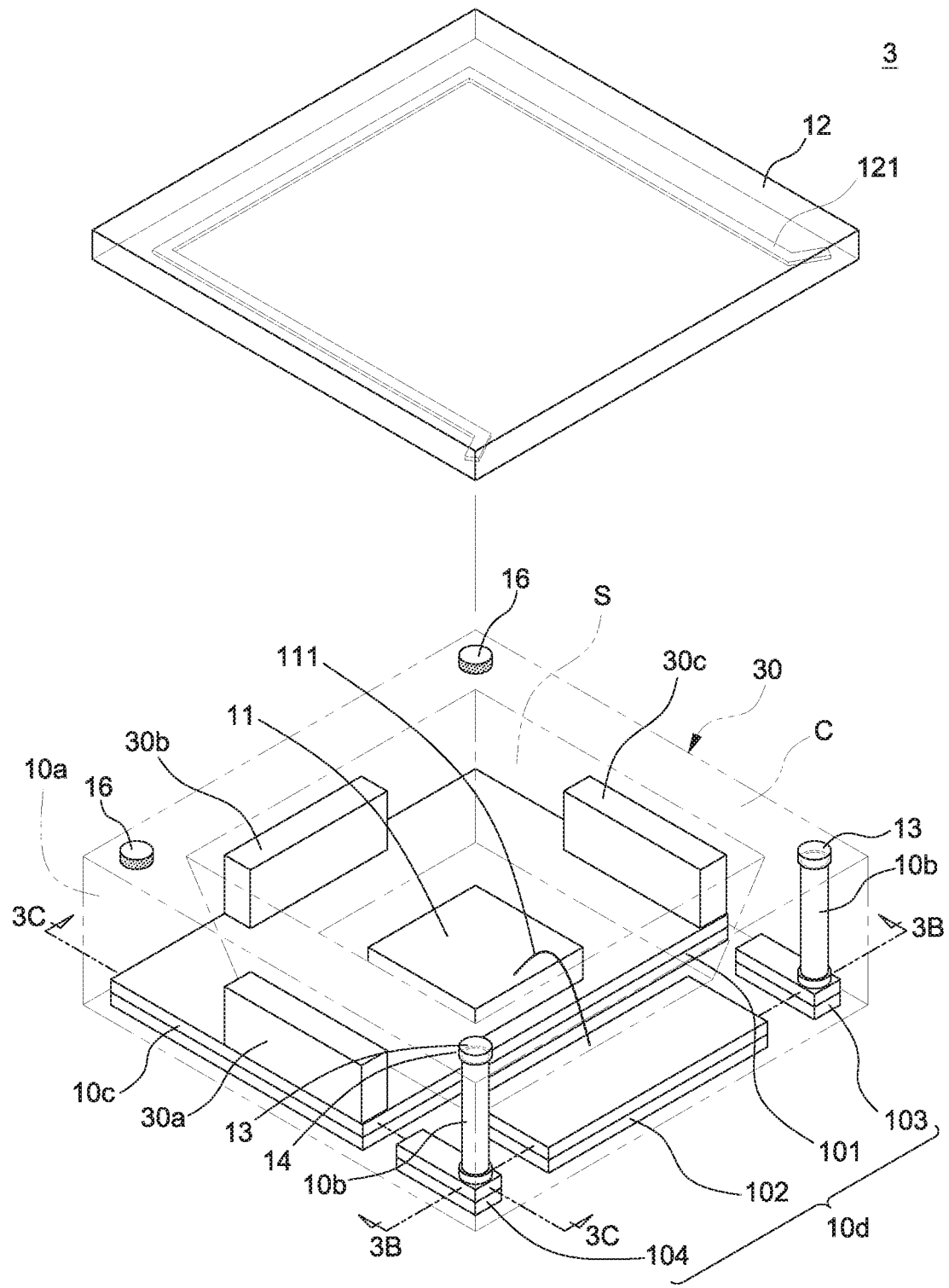
FIG. 3A illustrates a perspective view of a semiconductor device package according to some embodiments of the present disclosure.

FIG. 3A is a perspective view of a semiconductor device package 3 in accordance with some embodiments of the present disclosure. The semiconductor device package 3 of FIG. 3A is similar to the semiconductor device package 1 of FIG. 1A except that a carrier 30 in implemented that further include conductive plates 30a, 30b, and 30c.

The conductive plates 30a, 30b, and 30c are embedded in the encapsulant 10a. The conductive plates 30a, 30b, and 30c are disposed on the pad 101. The conductive plates 30a, 30b, and 30c are electrically connected to the pad 101 via the conductive layer 10c. The conductive plates 30a, 30b, and 30c surround the semiconductor device 11. The conductive plates 30a, 30b, and 30c are shielding plates for electromagnetic interference (EMI) shielding. A size (e.g. a length, a width, and/or a height) of the conductive plates 30a, 30b, and 30c may set according to design specifications. The conductive plates 30a, 30b, and 30c may include conductive material such as a conductive metal or alloy.

In some embodiments, an additional conductive plate may be disposed on the pad 102. In some embodiments, one of the conductive plates 30a, 30b, and 30c may be omitted. In some embodiments, two of the conductive plates 30a, 30b, and 30c may be omitted. In some embodiments, the conductive plates 30a, 30b, and 30c may be integrally formed as one conductive plate.

Figure 3B:
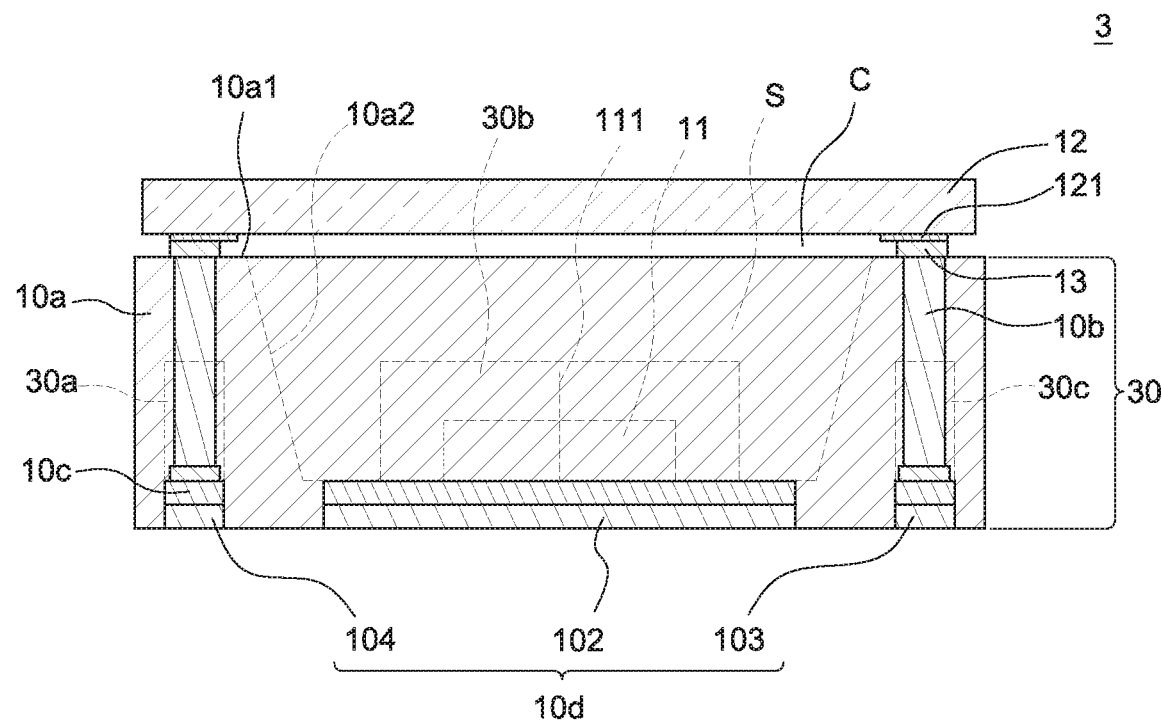
FIG. 3B illustrates a cross-sectional view of a semiconductor device package according to some embodiments of the present disclosure.

FIG. 3B is a cross-sectional view of the semiconductor device package 3 across line 3B in FIG. 3A according to some embodiments of the present disclosure.

The conductive plates 30a, 30b, and 30c are encapsulated by the encapsulant 10a. The conductive plates 30a, 30b, and 30c are covered by the lid 12. The conductive plates 30a, 30b, and 30c may be disposed adjacent to the semiconductor device 11.

Figure 3C:
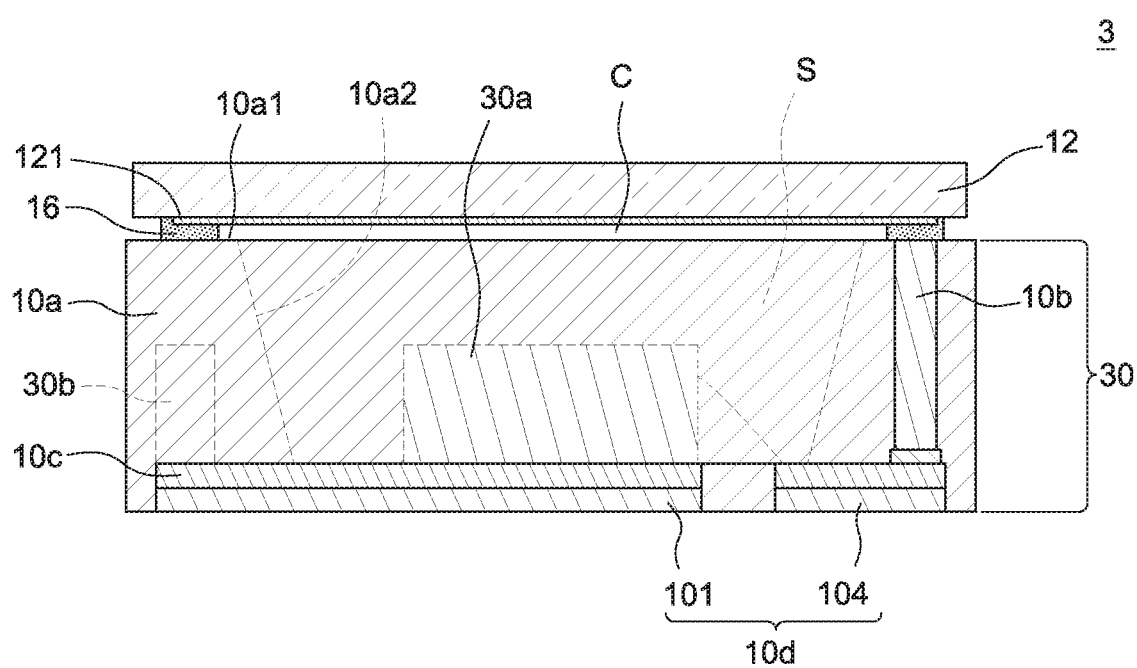
FIG. 3C illustrates a cross-sectional view of a semiconductor device package according to some embodiments of the present disclosure.

FIG. 3C is a cross-sectional view of the semiconductor device package 3 across line 3C in FIG. 3A according to some embodiments of the present disclosure. The conductive plates 30a, and 30c may be disposed adjacent to the conductive posts 10b.

Figure 4A:
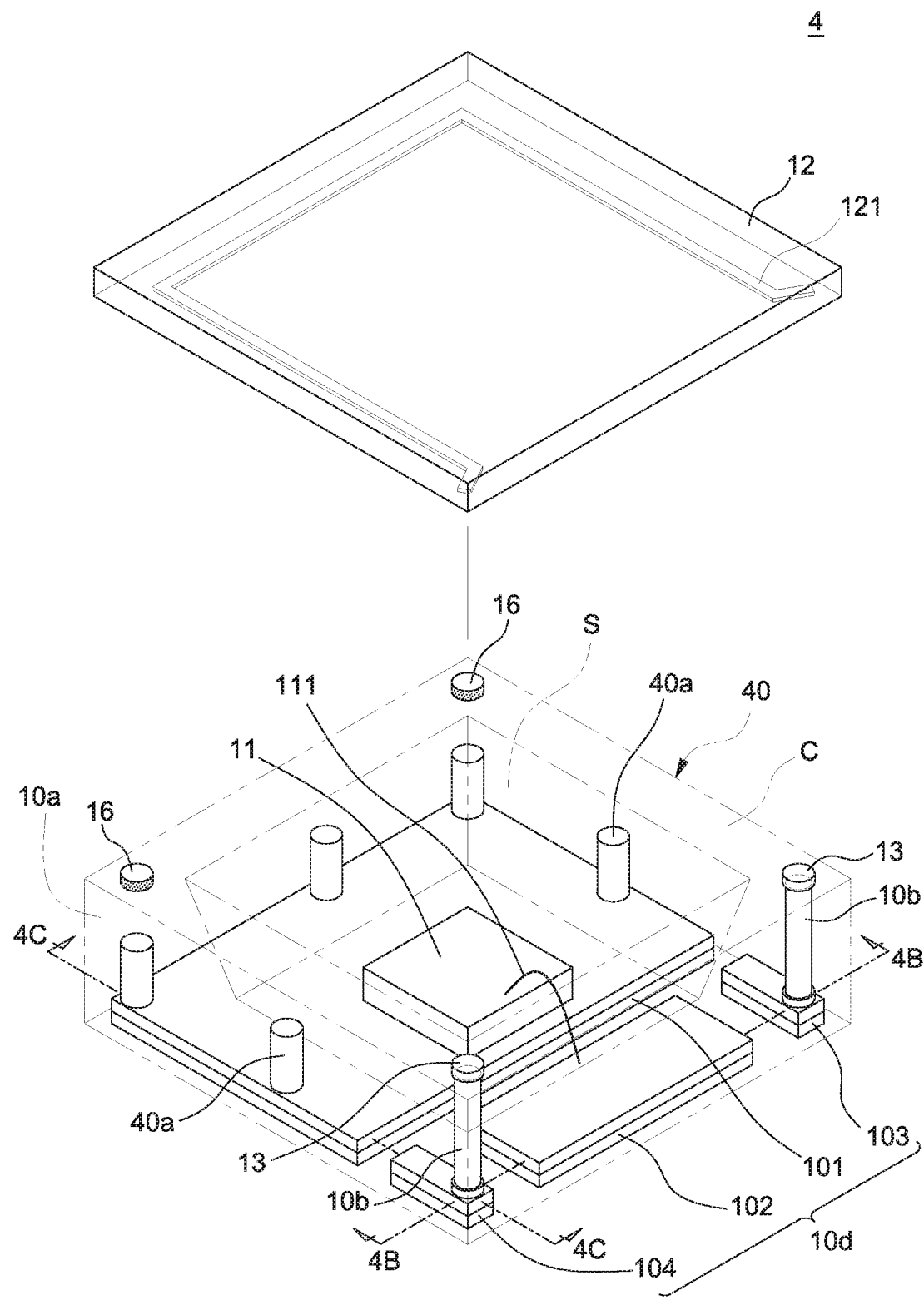
FIG. 4A illustrates a perspective view of a semiconductor device package according to some embodiments of the present disclosure.

FIG. 4A is a perspective view of a semiconductor device package 4 in accordance with some embodiments of the present disclosure. The semiconductor device package 4 of FIG. 4A is similar to the semiconductor device package 1 of FIG. 1A except that a carrier 40 further include a plurality of conductive post 40a.

The conductive posts 40a are embedded in the encapsulant 10a. The conductive posts 40a are disposed on the pad 101. The conductive posts 40a are electrically connected to the pad 101 via the conductive layer 10c. The conductive posts 40a surround the semiconductor device 11. The conductive posts 40a are shielding elements for EMI shielding. A size (e.g. a length, a width, and/or a height) of the conductive posts 40a may be set according to design specifications.

In some embodiments, an additional conductive post 40a may be disposed on the pad 102. In some embodiments, one single conductive post 40a may be disposed on the pad 101.

In some embodiments, the arrangement of the conductive posts 40a may be set according to design specifications.

Figure 4B:
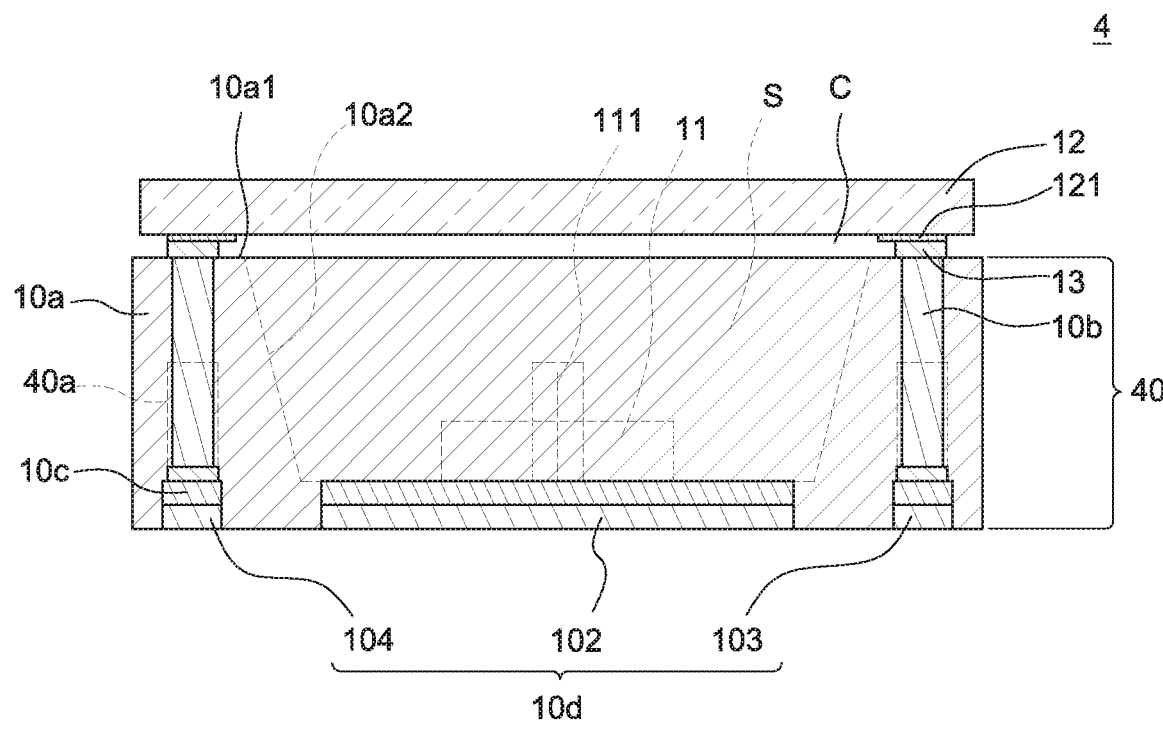
FIG. 4B illustrates a cross-sectional view of a semiconductor device package according to some embodiments of the present disclosure.

FIG. 4B is a cross-sectional view of the semiconductor device package 4 across line 4B in FIG. 4A according to some embodiments of the present disclosure.

The conductive posts 40a are encapsulated by the encapsulant 10a. The conductive posts 40a are covered by the lid 12. The conductive posts 40a may be disposed adjacent to the semiconductor device 11.

Figure 4C:
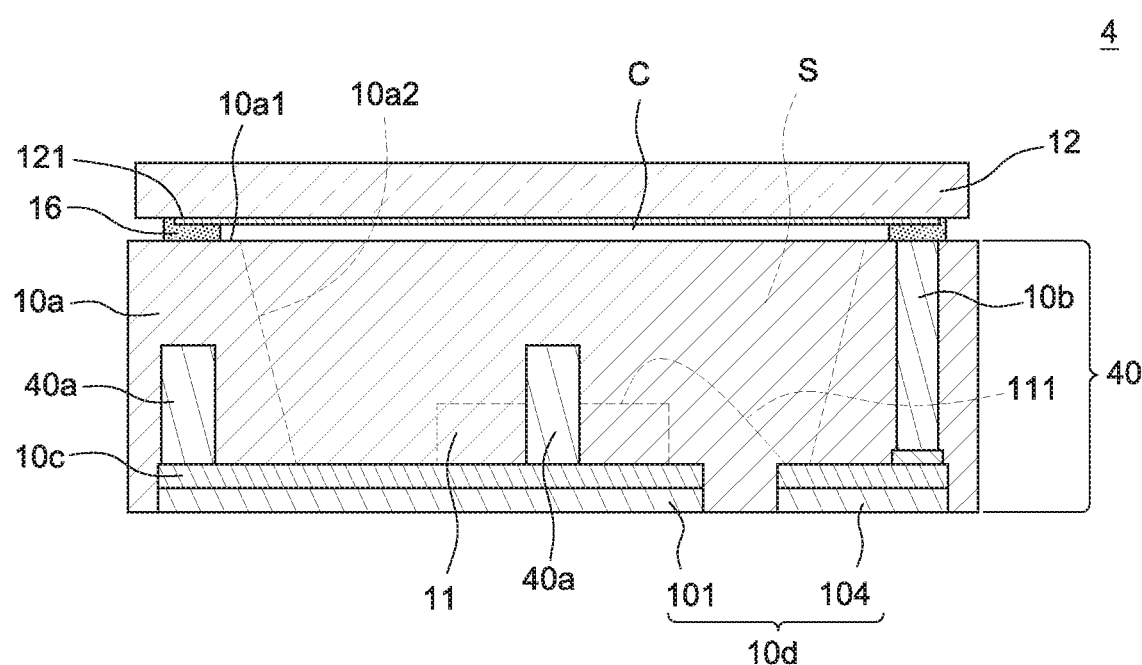
FIG. 4C illustrates a cross-sectional view of a semiconductor device package according to some embodiments of the present disclosure.

FIG. 4C is a cross-sectional view of the semiconductor device package 4 across line 4C in FIG. 4A according to some embodiments of the present disclosure. The conductive posts 40a may be disposed adjacent to the conductive posts 10b.

Figure 5A:
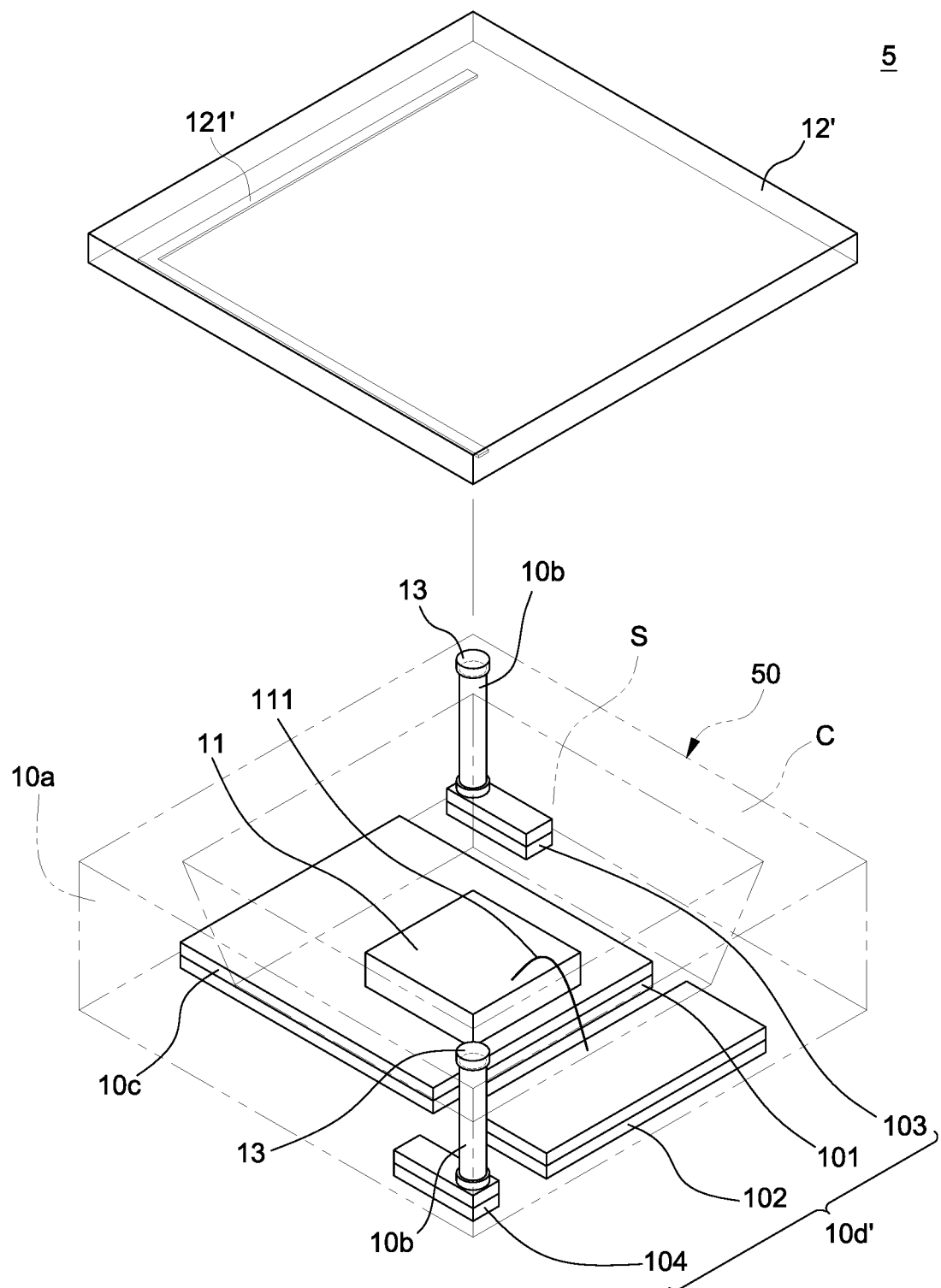
FIG. 5A illustrates a perspective view of a semiconductor device package according to some embodiments of the present disclosure.

FIG. 5A is a perspective view of a semiconductor device package 5 in accordance with some embodiments of the present disclosure. The semiconductor device package 5 includes a carrier 50, a semiconductor device 11, one or more conductive elements 13, and a lid 12'.

The carrier 50 includes an encapsulant 10a, a conductive post 10b, a conductive layer 10c, and a patterned conductive layer 10d'. The encapsulant 10a may include a molding compound, a ceramic material, or other suitable materials. The encapsulant 10a encapsulates the conductive post 10b, the conductive layer 10c, and the patterned conductive layer 10d'. The encapsulant 10a defines an accommodating space (S). The conductive post 10b extends between the one or more conductive elements 13 and the patterned conductive layer 10d'. The conductive post 10b may be a solid cylindrical post, a solid square post, or a solid post with a suitable shape. The conductive layer 10c is disposed on the patterned conductive layer 10d'. The conductive layer 10c may include a PPF, Ag, another conductive metal, or an alloy thereof. The conductive layer 10c may facilitate reflection of light. The patterned conductive layer 10d' may be a leadframe or a substrate. The patterned conductive layer 10d' may be a pre-molded leadframe. The patterned conductive layer 10d' includes conductive pads 101, 102, 103, and 104. The pad 103 is adjacent to the pad 101. The pad 104 is adjacent to the pad 102. The conductive post 10b is disposed on and electrically connected to the pad 103 via the conductive layer 10c. The conductive post 10b is disposed on and electrically connected to the pad 104 via the conductive layer 10c. The pad 101 is electrically connected to the pad 102. The pad 101 may be a cathode. The pad 102 may be an anode. The pad 101 and the pad 102 may have opposite electrical polarities. The pads 103 and 104 are configured to be electrically connected to an external device. The external device may be a driver, a controller, or a detector.

The semiconductor device 11 includes, or is in connected to, a conductive wire 111 electrically bonded to an active surface of the semiconductor device 11. The semiconductor device 11 is disposed in the accommodating space (S). The semiconductor device 11 is disposed on the conductive layer 10c via an adhesive (not denoted in FIG. 1A). The semiconductor device 11 may be electrically connected to the pad 101 via a conductive adhesive (not denoted in FIG. 1A). The semiconductor device 11 is electrically connected to the pad 102 via the conductive wire 111. The semiconductor device 11 may include, for example, a MEMS package, a MEMS microphone, a MEMS, a MEMS press sensor, or a MEMS gas sensor. The semiconductor device 11 may include a light emitting device or a light source, such as a VCSEL.

The conductive elements 13 are disposed between the carrier 50 and the lid 12'. The conductive elements 13 include a conductive material. The conductive elements 13 may include a conductive adhesive, a solder material, or other suitable conductive materials.

The lid 12' covers the carrier 50 and the semiconductor device 11. The lid 12' includes a patterned conductive layer (or conductive trace) 121'. The patterned conductive layer 121' is disposed on a lower surface of the lid 12'. The patterned conductive layer 121' is electrically connected to the pads 103 and 104 via the conductive posts 10b and the conductive element 13. The pads 103 and 104 of the patterned conductive layer 10d', the conductive layer 10c, the conductive posts 10b, the conductive element 13, and the patterned conductive layer 121' constitute at least part of an electric circuit, and may constitute an open circuit. The lid 12' may include a transparent material (e.g. having a transmittance of about 80% or more, or about 90% or more for light emitted by, or detected by, the semiconductor device 11) or an opaque material (e.g. having a transmittance of about 20% or less, or about 10% or less for light emitted by, or detected by, the semiconductor device 11). The lid 12' may include a conductive material or a dielectric material. In some embodiments, the lid may be made of a glass, a transparent metal (e.g. ITO or IZO), or a plastic. The lid 12' and the carrier 50 define a channel (C) in fluid/air communication with the accommodating space (S). The lid 12', the conductive element 13, and the carrier 50 define the channel (C) in fluid/air communication with the accommodating space (S). In some embodiments, the patterned conductive layer 121' may be embedded in and exposed by the lower surface of the lid 12'.

Figure 5B:
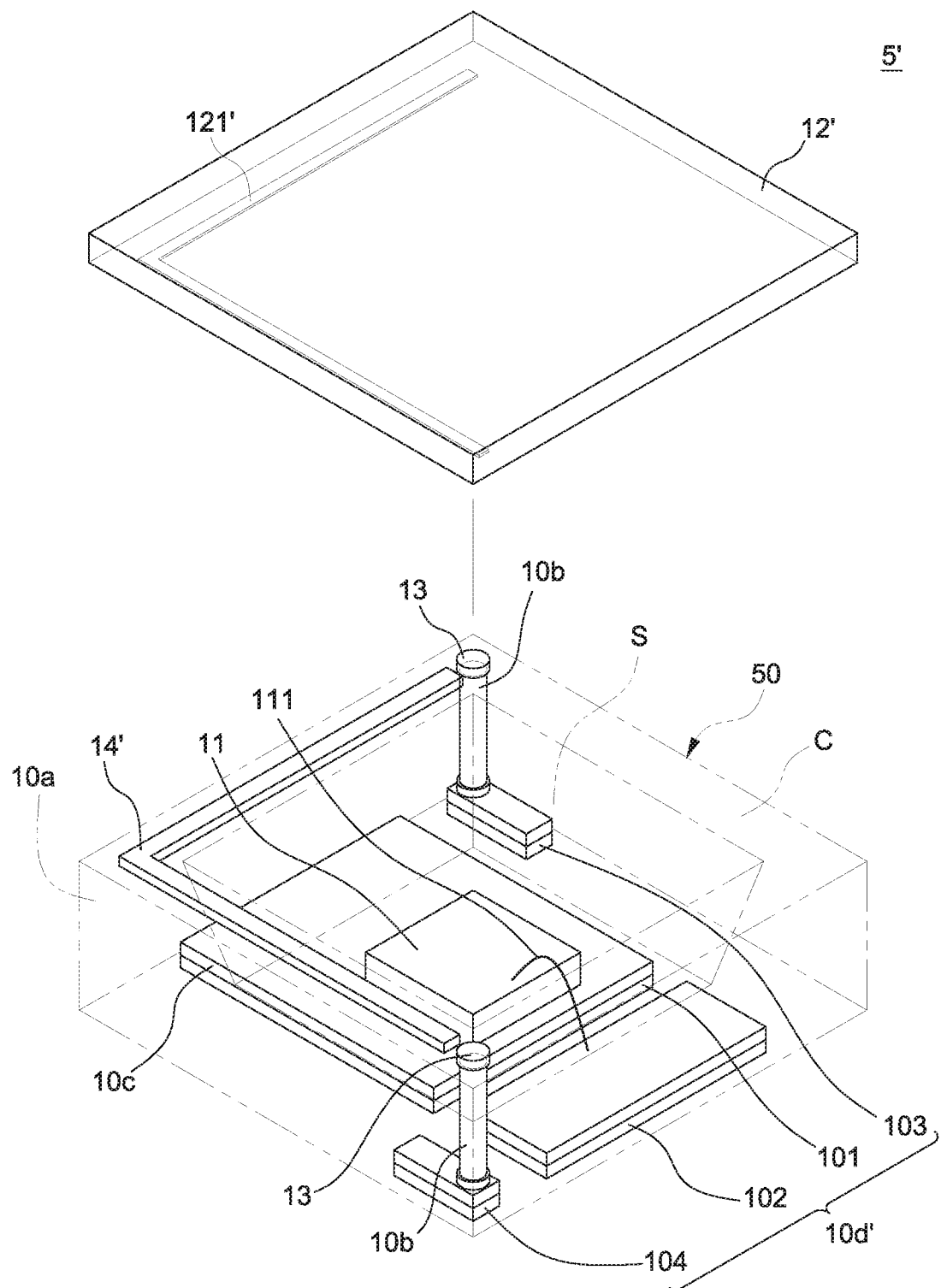
FIG. 5B illustrates a perspective view of a semiconductor device package according to some embodiments of the present disclosure.

FIG. 5B is a perspective view of a semiconductor device package 5' in accordance with some embodiments of the present disclosure. The semiconductor device package 5' of FIG. 5B is similar to the semiconductor device package 5 of FIG. 5A, except that an adhesive layer 14' is disposed on the carrier 50.

The adhesive layer 14' may be disposed under the patterned conductive layer 121' and on the carrier 50. The adhesive layer 14' is disposed on two adjacent sides of the carrier 50. The adhesive layer 14' is spaced from the conductive elements 13. The adhesive layer 14' may be disposed on one side of the carrier 50. The adhesive layer 14' includes a conductive material. The material of the adhesive layer 14' may be the same as the material of the conductive element 13. The adhesive layer 14' is electrically connected to the patterned conductive layer 121'. A size (e.g. a length, a width, and/or a thickness) of the adhesive layer 14' may be set according to design specifications. The lid 12' is secured to the carrier 50 via the conductive element 13 and the adhesive layer 14'.

Figure 5C:
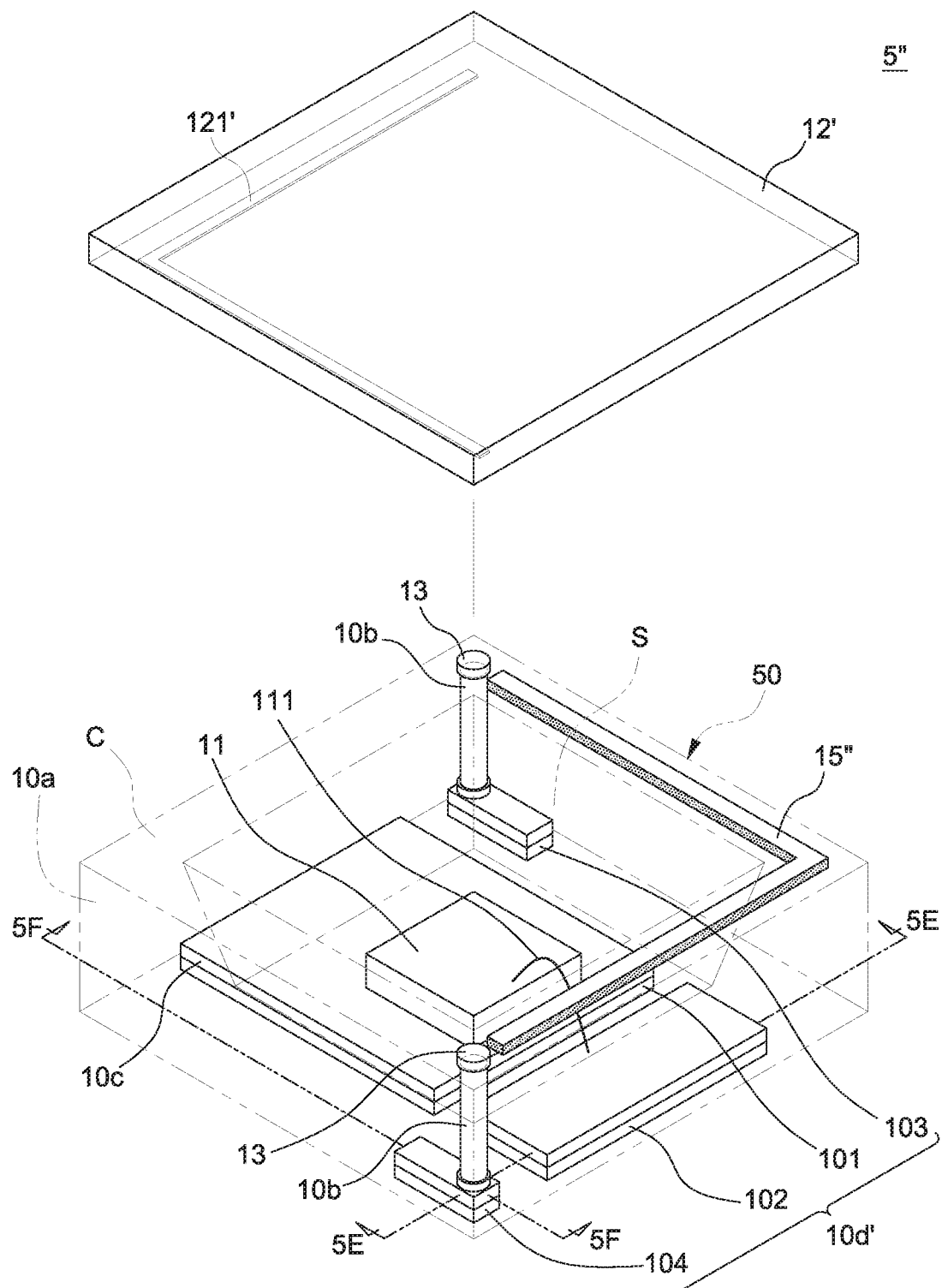
FIG. 5C illustrates a perspective view of a semiconductor device package according to some embodiments of the present disclosure.

FIG. 5C is a perspective view of a semiconductor device package 5'' in accordance with some embodiments of the present disclosure. The semiconductor device package 5'' of FIG. 5C is similar to the semiconductor device package 5 of FIG. 5A, except that an adhesive layer 15'' is disposed on the carrier 50. The adhesive layer 15'' is spaced from the conductive element 13.

Figure 5D:
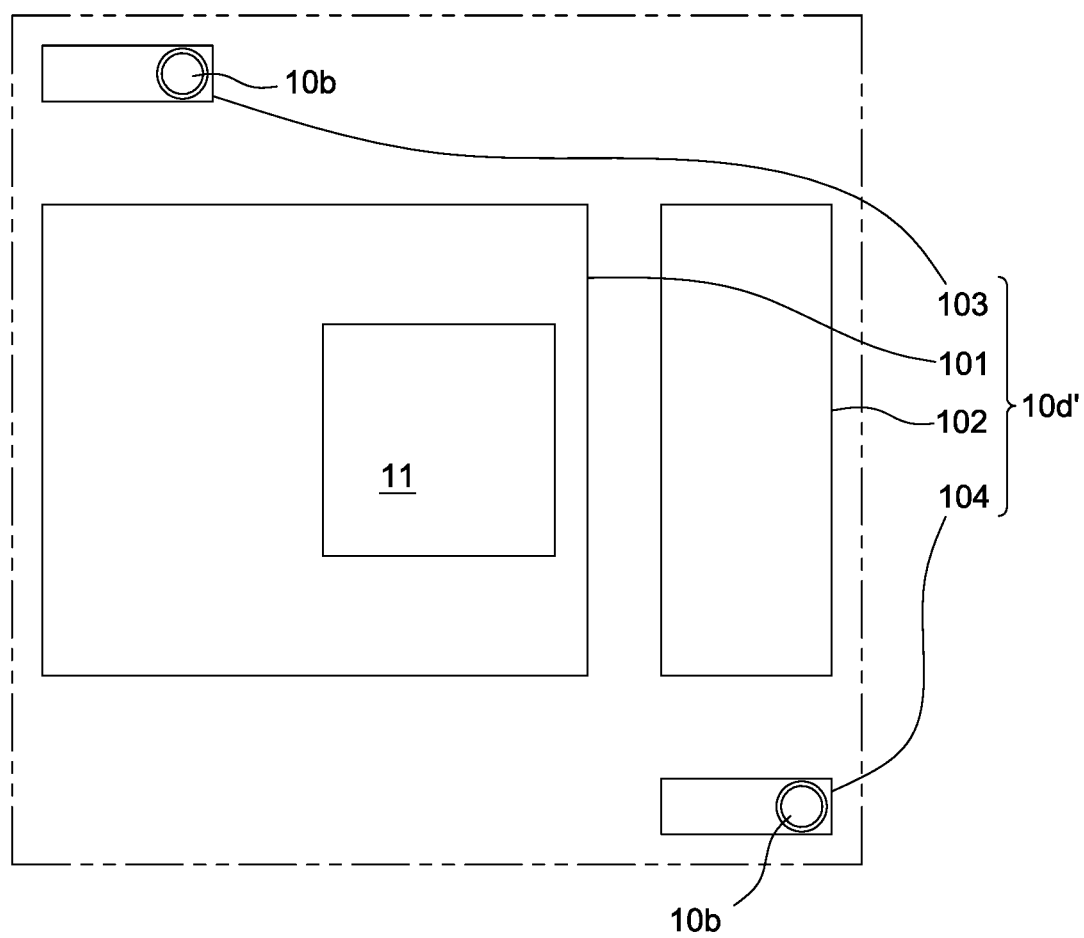
FIG. 5D illustrates a layout of a semiconductor device package according to some embodiments of the present disclosure.

FIG. 5D is a layout corresponding to the semiconductor device packages 5/5'/5'' according to some embodiments of the present disclosure. The patterned conductive layer 10d' may be a leadframe. The patterned conductive layer 10d' may be electrically connected to a system board (e.g. a PCB). The patterned conductive layer 10d' includes the conductive pads 101, 102, 103, and 104. Two conductive posts 10b are correspondingly disposed on the pads 103 and 104. The pad 101 is electrically connected to the pad 102. The pads 103 and 104 are electrically isolated from the pads 101 and 102.

Figure 5E:
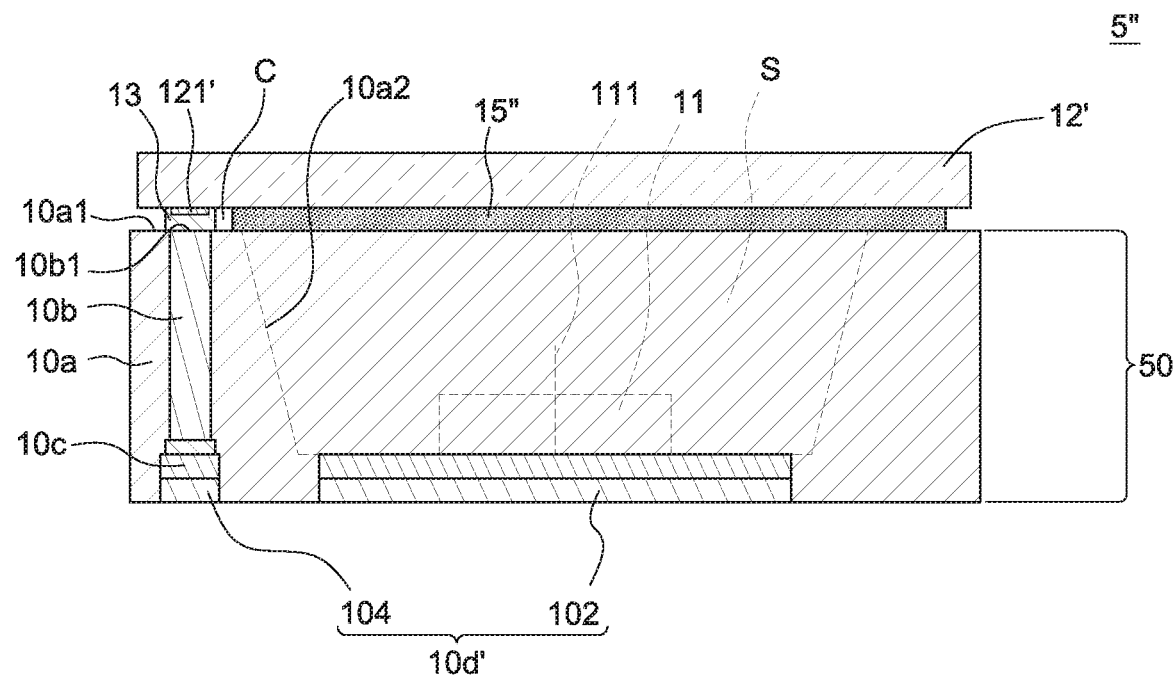
FIG. 5E illustrates a cross-sectional view of a semiconductor device package according to some embodiments of the present disclosure.

FIG. 5E is a cross-sectional view of the semiconductor device package 5" across line 5E in FIG. 5C according to some embodiments of the present disclosure. The conductive element 13 is disposed between the carrier 50 and the lid 12'. The lid 12' is attached on the carrier 50 via the conductive element 13. The patterned conductive layer 121' is electrically connected to the conductive element 13.

The carrier 50 has an upper surface 10a1 and a side surface 10a2. The side surface 10a2 has a slope. The accommodating space (S) is defined by the side surface 10a2. The conductive post 10b has an upper surface 10b1. The upper surface 10a1 of the encapsulant 10a and the upper surface 10b1 of the conductive post 10b are substantially coplanar. The channel (C) defined by the carrier 50, the conductive element 13, and the lid 12' may be used as an air venting channel to fluidly release vapor or moisture.

The conductive element 13 is disposed on the carrier 50. The conductive element 13 is disposed between the patterned conductive layer 121' and the conductive post 10b. The patterned conductive layer 121' is surrounded by the conductive element 13. The patterned conductive layer 121' is electrically connected to the conductive posts 10b. The pad 103 is electrically connected to the pad 104 via the patterned conductive layer 121' and the conductive posts 10b. The pads 103 and 104 of the patterned conductive layer 10d' and the patterned conductive layer 121' constitute at least part of an electric circuit, and may constitute an open circuit. The pads 103 and 104 of the patterned conductive layer 10d', the conductive posts 10b, and the patterned conductive layer 121' constitute at least part of an electric circuit, and may constitute an open circuit. The pads 103 and 104 are electrically connected to the external device. Once the lid 12' is detached from the carrier 50, a short circuit occurs (e.g. between the pad 103 and the pad 104). When the short circuit is detected by the external device, the power of the semiconductor device 11 may be cut off. Accordingly, if the semiconductor device 11 is a light emitting device, the semiconductor device 11 would stop operating and thus avoid shining light in to a person's eyes (e.g. a person who removed the lid 12'), or avoiding light pollution or emission of light that is otherwise undesirable.

Figure 5F:
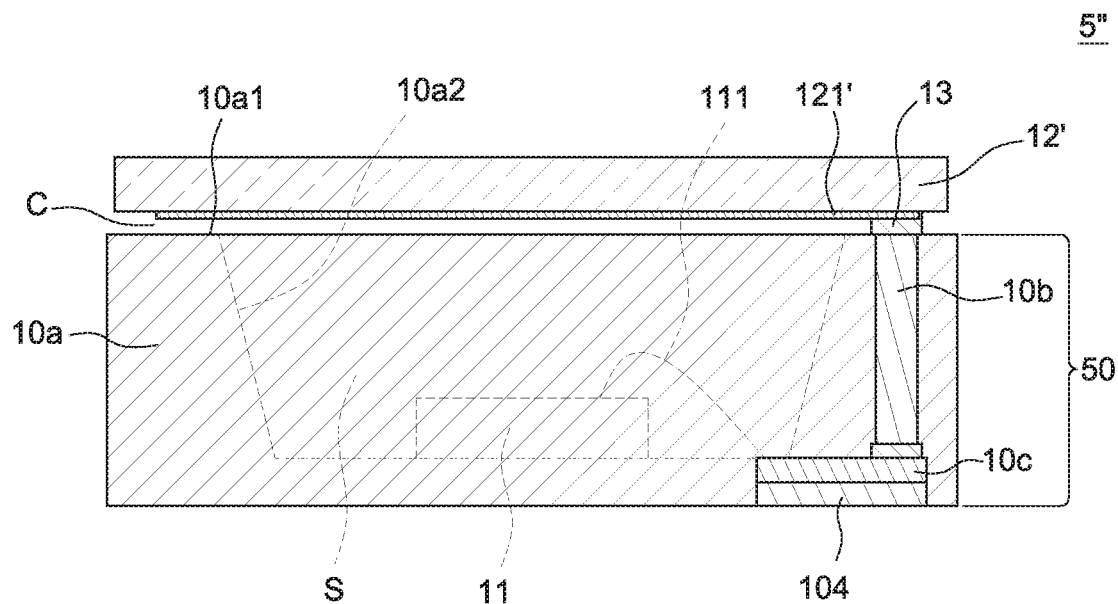
FIG. 5F illustrates a cross-sectional view of a semiconductor device package according to some embodiments of the present disclosure.

FIG. 5F is a cross-sectional view of the semiconductor device package 5" across line 5F in FIG. 5C according to some embodiments of the present disclosure. The patterned conductive layer 121' is surrounded by the conductive element 13. The patterned conductive layer 121' is covered by the conductive element 13. The conductive element 13 is disposed between the carrier 50 and the lid 12'. The lid 12' is attached on the carrier 50 via the conductive element 13.

The channel (C) defined by the carrier 50 and the lid 12' may be used as an air venting channel to fluidly release vapor or moisture. The channel (C) can help to prevent a pop-corn effect during a thermal cycle in an operation of manufacturing the semiconductor device package.

Figure 6A:
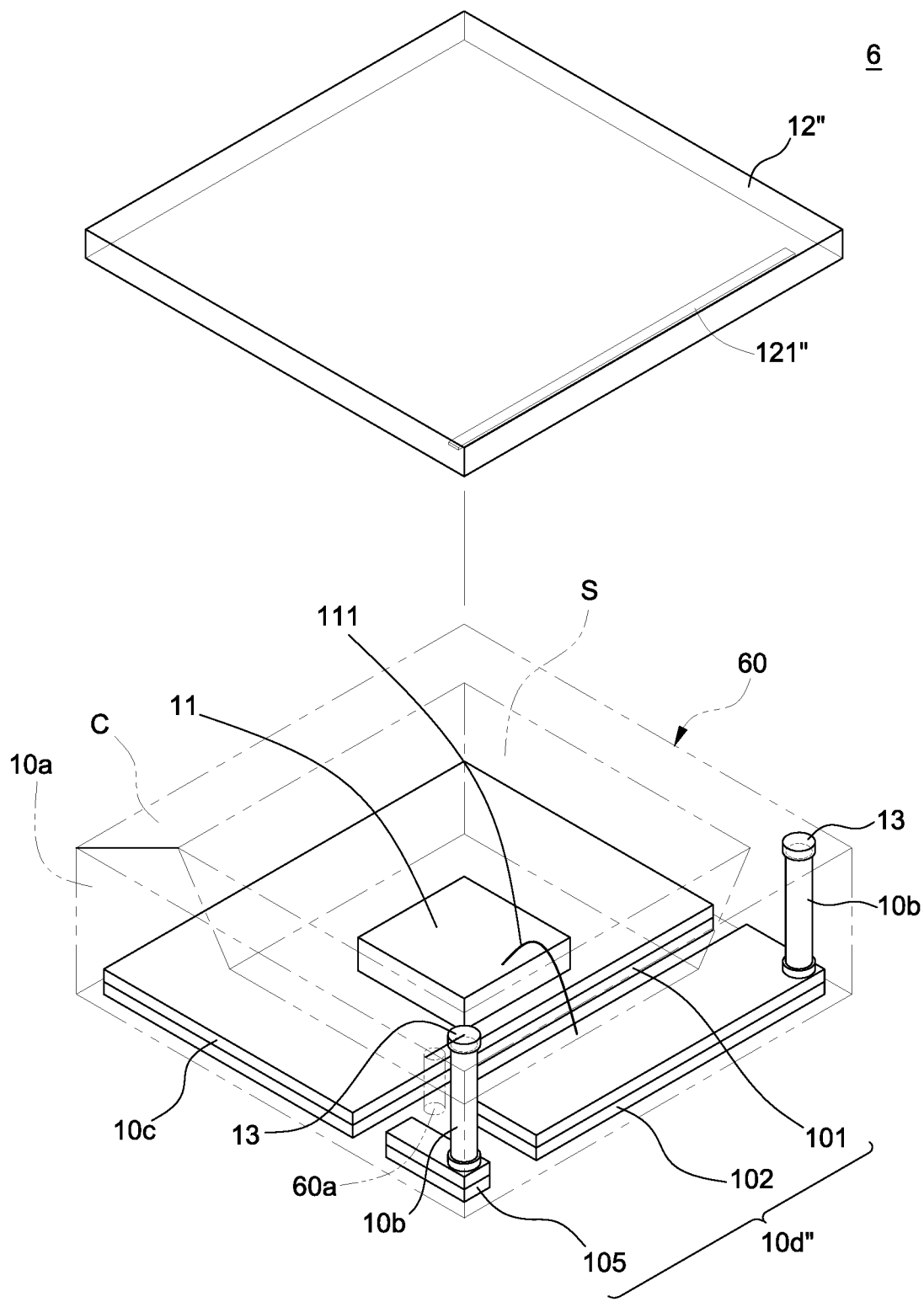
FIG. 6A illustrates a perspective view of a semiconductor device package according to some embodiments of the present disclosure.

FIG. 6A is a perspective view of a semiconductor device package 6 in accordance with some embodiments of the present disclosure. The semiconductor device package 6 includes a carrier 60, a semiconductor device 11, one or more conductive elements 13, and a lid 12".

The carrier 60 includes an encapsulant 10a, a conductive post 10b, a conductive layer 10c, and a patterned conductive layer 10d'''. The encapsulant 10a may include a molding compound, a ceramic material, or other suitable materials. The encapsulant 10a encapsulates the conductive post 10b, the conductive layer 10c, and the patterned conductive layer 10d'''. The encapsulant 10a defines an accommodating space (S). The conductive post 10b extends between the conductive element 13 and the patterned conductive layer 10d'''. The conductive post 10b may be a solid cylindrical post, a solid square post, or a solid post with a suitable shape. The conductive layer 10c is disposed on the patterned conductive layer 10d'''. The conductive layer 10c may include a PPF, Ag, another conductive metal, or an alloy thereof. The conductive layer 10c may facilitate reflection of light. The patterned conductive layer 10d''' may be a leadframe or a substrate. The patterned conductive layer 10d''' may be a pre-molded leadframe. The patterned conductive layer 10d''' includes conductive pads 101, 102, and 105. The conductive post 10b is disposed on and electrically connected to the pad 102 via the conductive layer 10c. The conductive post 10b is disposed on and electrically connected to the pad 105 via the conductive layer 10c. The pad 101 is electrically connected to the pad 102. The pad 101 may be a cathode. The pad 102 or the pad 103 may be an anode. The pad 101 and the pad 102 may have opposite electrical polarities. The pads 101, 102, and 103 are electrically connected to each other.

The carrier 60 may define a through hole 60a in the encapsulant 10a. The through hole 60a is adjacent to the pads 101, 102, and 105. The through hole 60a is in fluid/air communication with the accommodating space (S). The through hole 60a in the carrier 60 may be used as an air venting through hole to fluidly release vapor or moisture so as to help prevent a pop-corn effect. In some embodiments, the through hole 60a may be omitted.

The semiconductor device 11 includes, or is connected to, a conductive wire 111 electrically bonded to an active surface of the semiconductor device 11. The semiconductor device 11 is disposed in the accommodating space (S). The semiconductor device 11 is disposed on the conductive layer 10c via an adhesive (not denoted in FIG. 6A). The semiconductor device 11 may be electrically connected to the pad 101 via a conductive adhesive (not denoted in FIG. 6A). The semiconductor device 11 is electrically connected to the pad 102 via the conductive wire 111. The semiconductor device 11 may include, for example, a MEMS package, a MEMS microphone, a MEMS, a MEMS press sensor, or a MEMS gas sensor. The semiconductor device 11 may include a light emitting device or a light source, such as a VCSEL.

The conductive elements 13 are disposed between the carrier 60 and the lid 12". The conductive elements 13 include a conductive material. The conductive elements 13 may include a conductive adhesive, a solder material, or other suitable conductive materials.

The lid 12" covers the carrier 60 and the semiconductor device 11. The lid 12" includes a patterned conductive layer (or conductive trace) 121". The patterned conductive layer 121" is disposed on a lower surface of the lid 12". The patterned conductive layer 121" is electrically connected to the pads 102 and 105 via the conductive posts 10b and the conductive element 13. The pads 101, 102, and 105 of the patterned conductive layer 10d''', the conductive posts 10b, the conductive element 13, and the conductive trace 121 constitute at least part of an electric circuit, and may constitute an open circuit. The lid 12" may include a transparent material (e.g. having a transmittance of about 80% or more, or about 90% or more for light emitted by, or detected by, the semiconductor device 11) or an opaque material (e.g. having a transmittance of about 20% or less, or about 10% or less for light emitted by, or detected by, the semiconductor device 11). The lid 12" may include a conductive material or a dielectric material. In some embodiments, the lid 12" may be made of a glass, a transparent metal (e.g. ITO or IZO), or a plastic. The lid 12" and the carrier 60 define a channel (C) in fluid/air communication with the accommodating space. The lid 12", the conductive element 13, and the carrier 60 define the channel (C) in fluid/air communication with the accommodating space. In some embodiments, the patterned conductive layer 121" may be embedded in and exposed by the lower surface of the lid 12".

Figure 6B:
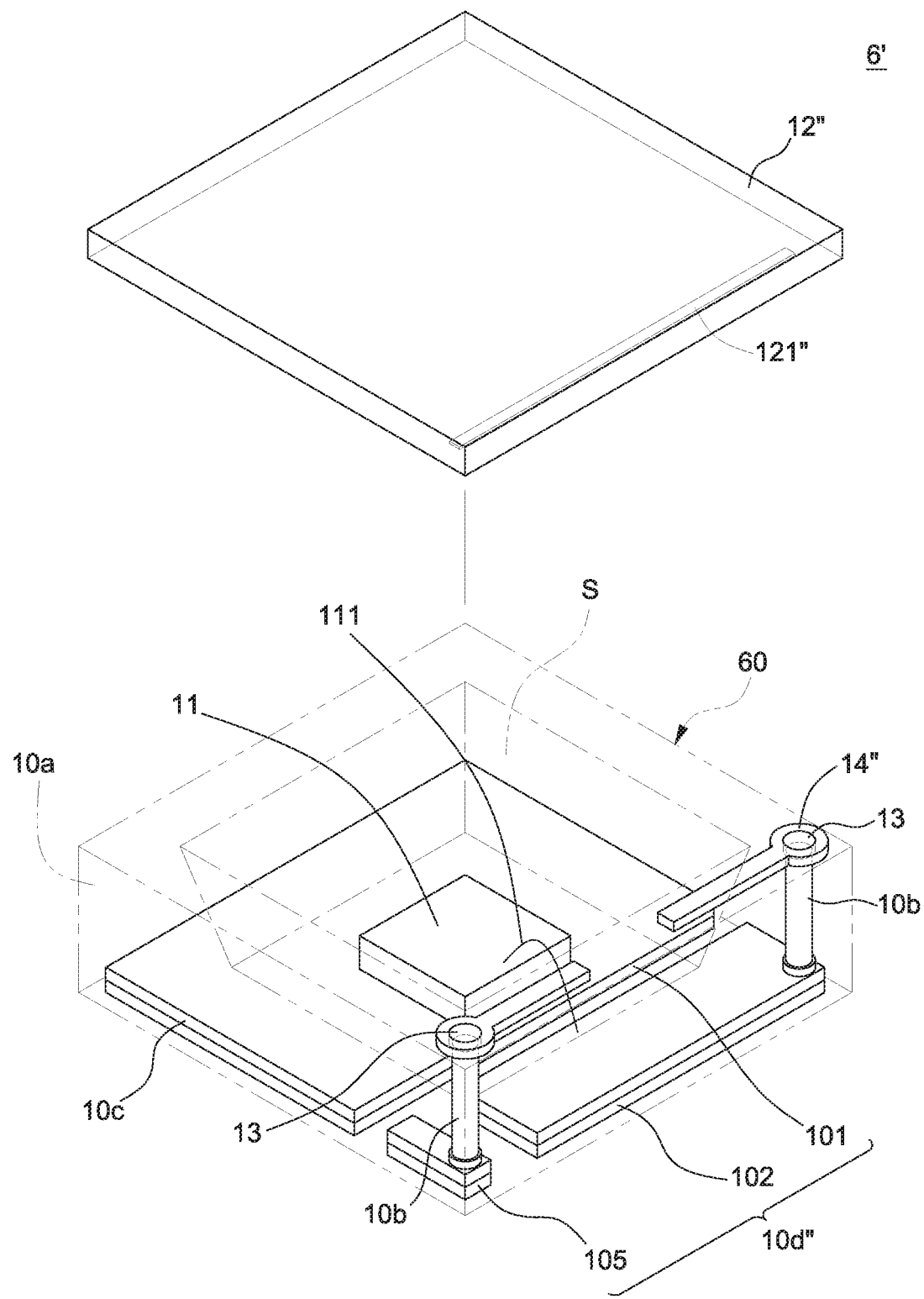
FIG. 6B illustrates a perspective view of a semiconductor device package according to some embodiments of the present disclosure.

FIG. 6B is a perspective view of a semiconductor device package 6' in accordance with some embodiments of the present disclosure. The semiconductor device package 6' of FIG. 6B is similar to the semiconductor device package 6 of FIG. 6A, except that an adhesive layer 14" is disposed on the carrier 60.

The adhesive layer 14" is disposed adjacent to the conductive element 13. The adhesive layer 14" surrounds one or more of the conductive elements 13. The adhesive layer 14" may contact one or more of the conductive elements 13. The adhesive layer 14" may be spaced from one or more of the conductive elements 13. The adhesive layer 14" may partially cover one or more of the conductive elements 13. The adhesive layer 14" may be disposed above one or more of the pads 102 and 105. The adhesive layer 14" includes a conductive material. The material of the adhesive layer 14" may be the same as the material of the conductive element 13. The adhesive layer 14" is electrically connected to the patterned conductive layer 121". The adhesive layer 14" is electrically connected to the conductive post 10b. A size (e.g. a length, a width, and/or a thickness) of the adhesive layer 14" may be flexibly set according to design specifications. In some embodiments, two adhesive layers 14" (or two portions of the adhesive layer 14") may be implemented, and may be separated or isolated. In some embodiments, the two adhesive layers 14" (or two portions of the adhesive layer 14") define a gap.

Figure 6C:
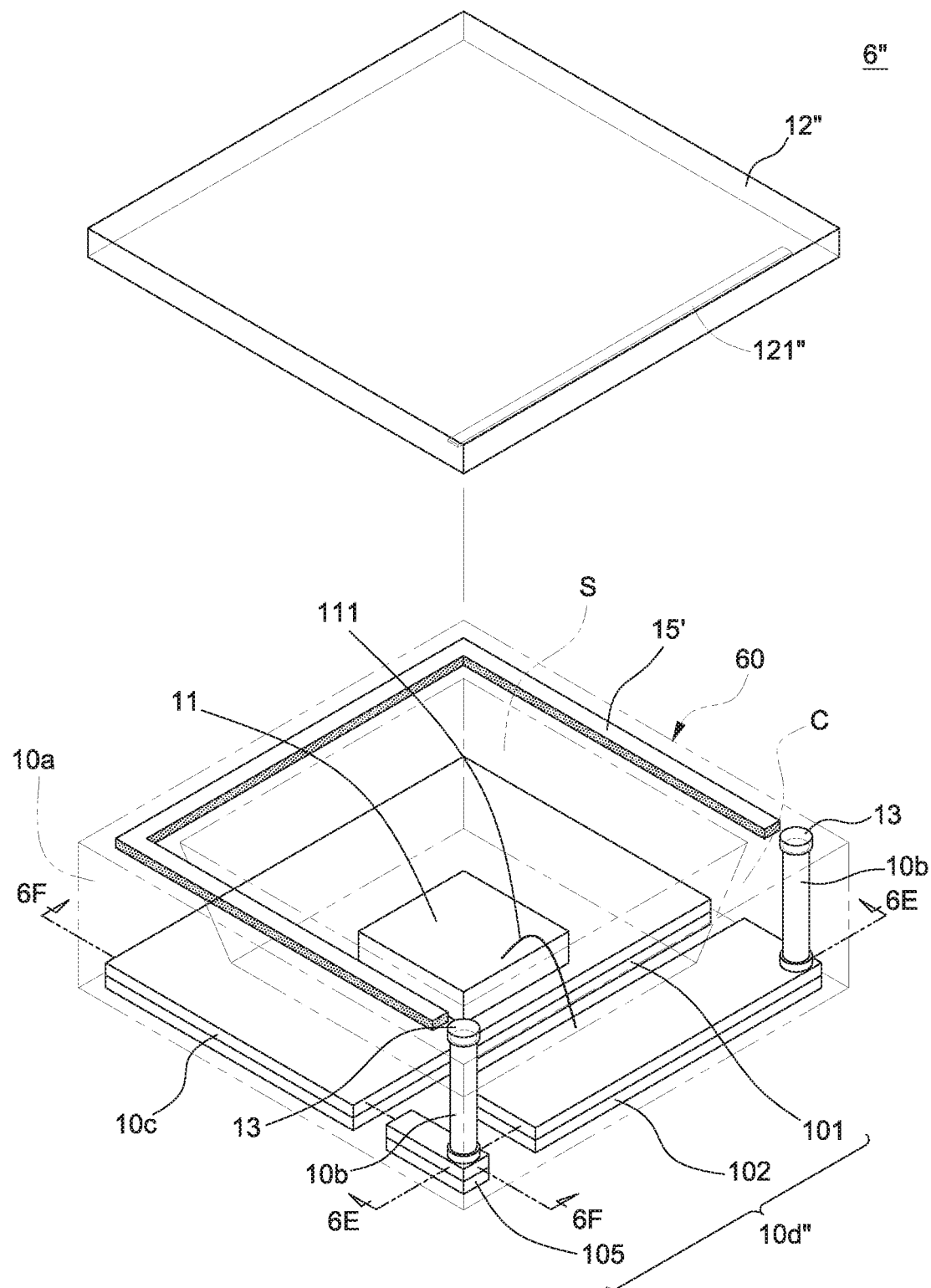
FIG. 6C illustrates a perspective view of a semiconductor device package according to some embodiments of the present disclosure.

FIG. 6C is a perspective view of a semiconductor device package 6" in accordance with some embodiments of the present disclosure. The semiconductor device package 6" of FIG. 6C is similar to the semiconductor device package 6 of FIG. 6A, except that an adhesive layer 15' is disposed on the carrier 60. The adhesive layer 15' partially surrounds the semiconductor device 11. The adhesive layer 15' may be adjacent to the conductive element 13. The adhesive layer 15' may be spaced from the conductive element 13. The adhesive layer 15' may extend on three sides of the carrier 60, which can provide for the lid 12" being securely attached to the carrier 60.

In some embodiments, the adhesive layers 14" may be disposed between the conductive elements 13. The adhesive layer 15' may be adjacent to the adhesive layers 14". The adhesive layer 15' is spaced from the adhesive layers 14".

Figure 6D:
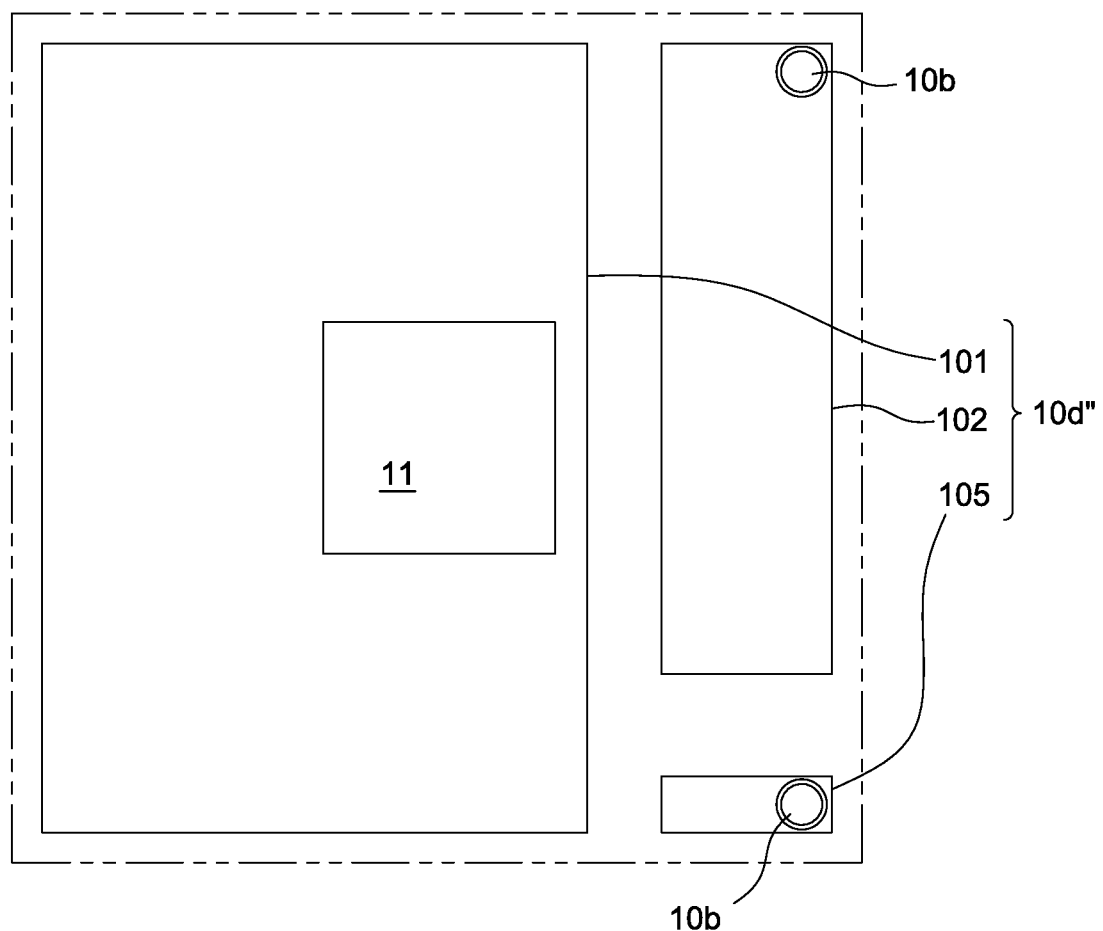
FIG. 6D illustrates a layout of a semiconductor device package according to some embodiments of the present disclosure.

FIG. 6D is a layout corresponding to the semiconductor device packages 6/6'/6" according to some embodiments of the present disclosure. The patterned conductive layer 10d" may be a leadframe. The patterned conductive layer 10d" may be electrically connected to a system board (e.g. a PCB). The patterned conductive layer 10d" includes the conductive pads 101, 102, and 105. Two conductive posts 10b are correspondingly disposed on the pads 102 and 105. The pad 101 may be electrically connected to the pad 102 or the pad 105.

Figure 6E:
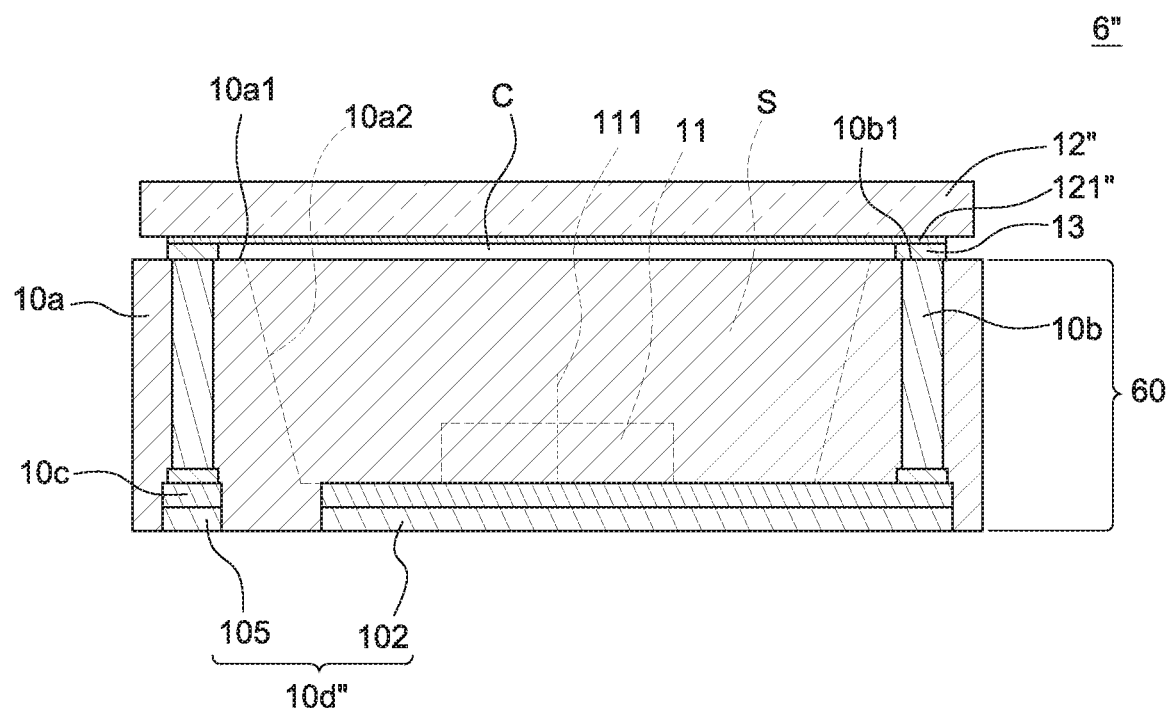
FIG. 6E illustrates a cross-sectional view of a semiconductor device package according to some embodiments of the present disclosure.

FIG. 6E is a cross-sectional view of the semiconductor device package 6" across line 6E in FIG. 6C according to some embodiments of the present disclosure. The conductive element 13 is disposed between the carrier 60 and the lid 12". The lid 12" is attached on the carrier 60 via the conductive element 13. The patterned conductive layer 121" is electrically connected to the conductive element 13. The carrier 60, the conductive element 13, and the lid 12" define the channel (C).

The carrier 60 has an upper surface 10a1 and a side surface 10a2. The side surface 10a2 has a slope. The accommodating space (S) is defined by the side surface 10a2. The conductive post 10b has an upper surface 10b1. The upper surface 10a1 of the encapsulant 10a and the upper surface 10b1 of the conductive post 10b are substantially coplanar.

The conductive element 13 is disposed on the carrier 60. The conductive element 13 is disposed between the patterned conductive layer 121" and the conductive post 10b. The patterned conductive layer 121" is electrically connected to the conductive posts 10b. The pad 102 is electrically connected to the pad 105 via the patterned conductive layer 121" and the conductive posts 10b. The pads 102 and 105 of the patterned conductive layer 10d" and the patterned conductive layer 121" constitute at least part of an electric circuit, and may constitute an open circuit. The pads 102 and 105 of the patterned conductive layer 10d", the conductive posts 10b, and the patterned conductive layer 121" constitute at least part of an electric circuit, and may constitute an open circuit. The pads 101, 102, and 105 of the patterned conductive layer 10d", the conductive layer 10c, the conductive posts 10b, and the patterned conductive layer 121" constitute at least part of an electric circuit, and may constitute an open circuit. Once the lid 12" is detached from the carrier 60, a short circuit occurs (e.g. between the pad 103 and the pad 104), and the power of the semiconductor device 11 may be cut off. Accordingly, if the semiconductor device 11 is a light emitting device, the semiconductor device 11 would stop operating and would thus avoid shining light in to a person's eyes (e.g. a person who removed the lid 12"), or avoiding light pollution or emission of light that is otherwise undesirable.

Figure 6F:
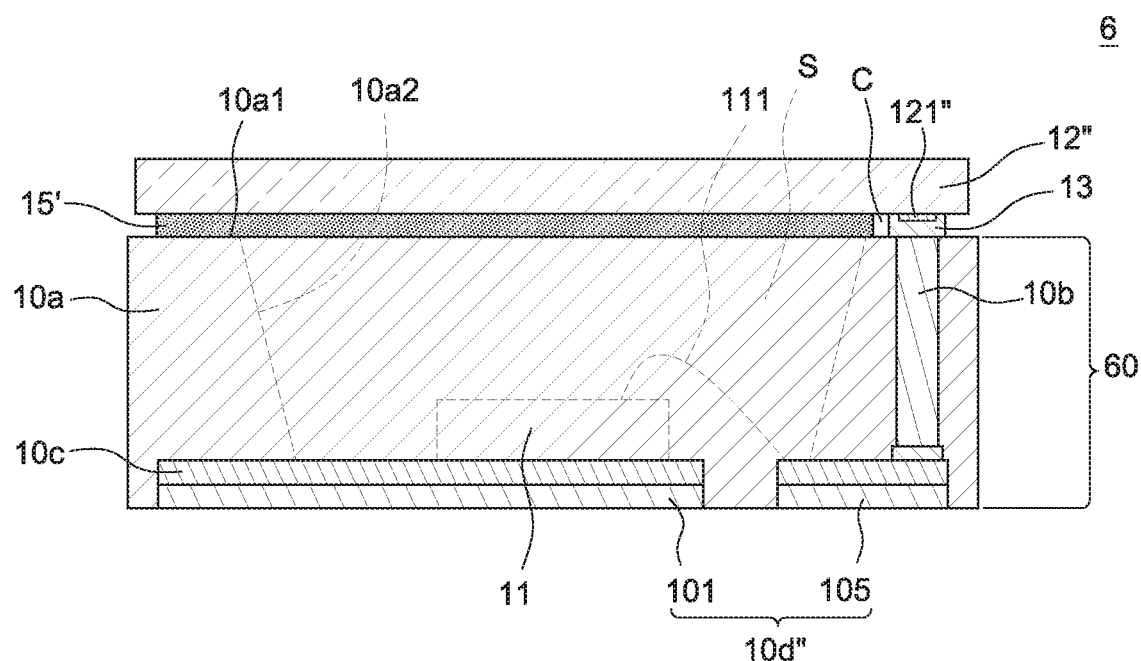
FIG. 6F illustrates a cross-sectional view of a semiconductor device package according to some embodiments of the present disclosure.

FIG. 6F is a cross-sectional view of the semiconductor device package 6" across line 6F in FIG. 6C according to some embodiments of the present disclosure. The patterned conductive layer 121" is surrounded by the conductive element 13. The patterned conductive layer 121" is covered by the conductive element 13. The adhesive layer 15' is disposed between the carrier 60 and the lid 12". The lid 12" is attached on the carrier 60 via the adhesive layer 15'.

The channel (C) defined by the carrier 60, the adhesive layer 15', the conductive element 13, and the lid 12" may be used as an air venting channel to fluidly release vapor or moisture. The channel (C) can help to prevent a pop-corn effect during a thermal cycle in an operation of manufacturing the semiconductor device package.

Figure 6G:
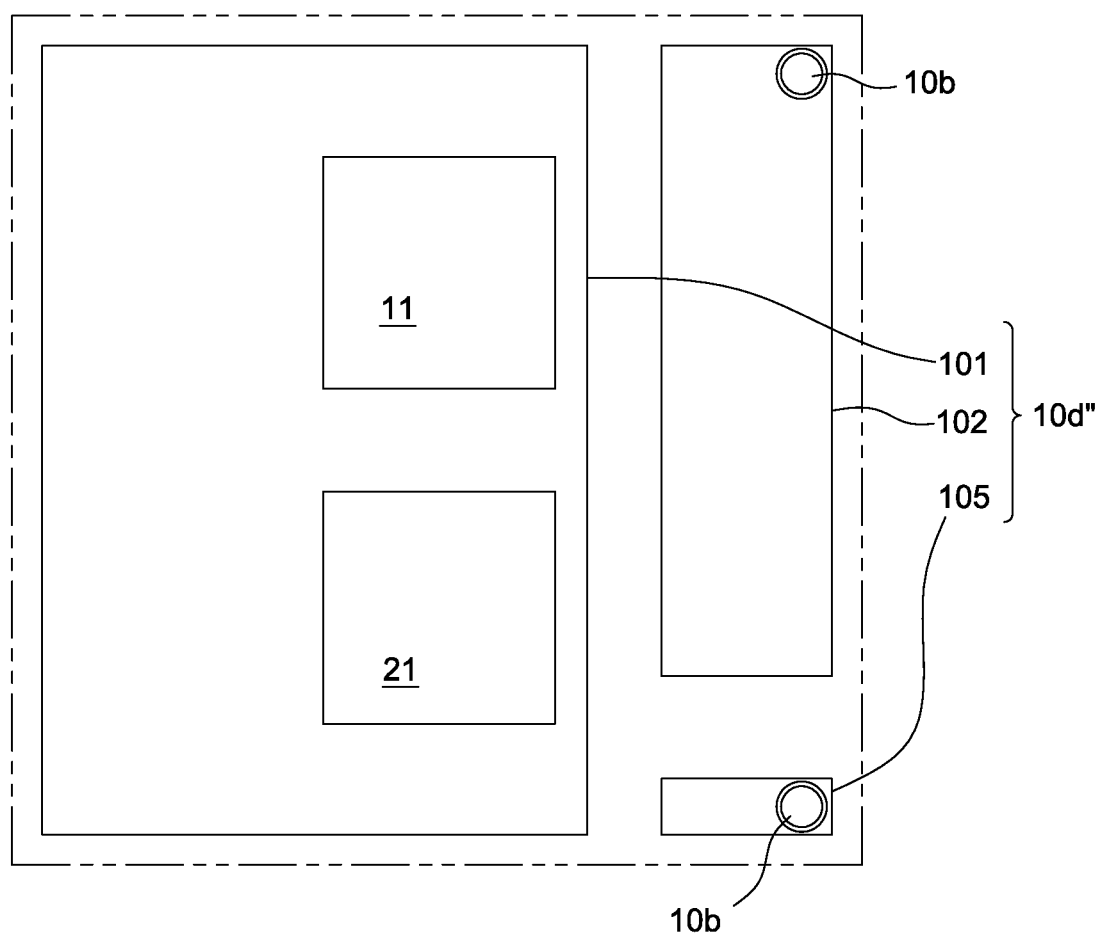
FIG. 6G illustrates a layout of a semiconductor device package according to some embodiments of the present disclosure.

FIG. 6G is a layout corresponding to the semiconductor device packages 6/6'/6" according to some embodiments of the present disclosure. The structure of FIG. 6G is similar to the structure of FIG. 6D except that a semiconductor device 21 is disposed on the pad 101. The semiconductor device 21 has, or is connected to, a conductive wire (not denoted in FIG. 6G) electrically bonded to an active surface of the semiconductor device 21. The semiconductor device 21 may be electrically connected to the pad 102 or the pad 105.

FIG. 7A through FIG. 7F illustrate a method of manufacturing the semiconductor device package 1" of FIG. 1C according to some embodiments of the present disclosure.

Figure 7A:
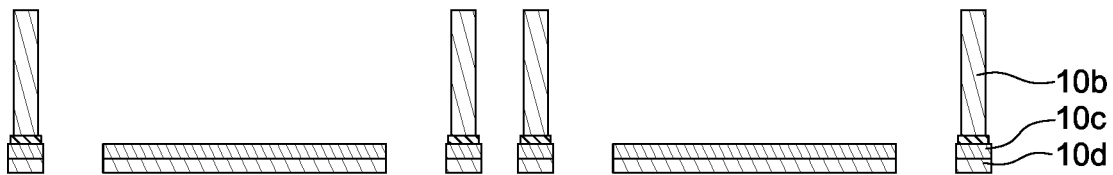
FIG. 7A illustrates a method of manufacturing a semiconductor device package according to some embodiments of the present disclosure.

Referring to FIG. 7A, a method for manufacturing the semiconductor device package 1" includes providing a patterned conductive layer 10d. The patterned conductive layer 10d may be a pre-formed leadframe. A conductive layer 10c may be disposed on the patterned conductive layer 10d. The patterned conductive layer 10d may be pre-treated to form the conductive layer 10c. A conductive post 10b is disposed on the conductive layer 10c. The conductive post 10b may be a pre-formed solid conductive post. The conductive post 10b may include copper (Cu) or other suitable materials. The conductive post 10b may be disposed on the conductive layer 10c through a conductive material (e.g. a conductive adhesive, tin (Sn), another conductive metal, an alloy thereof, or other suitable materials).

Figure 7B:
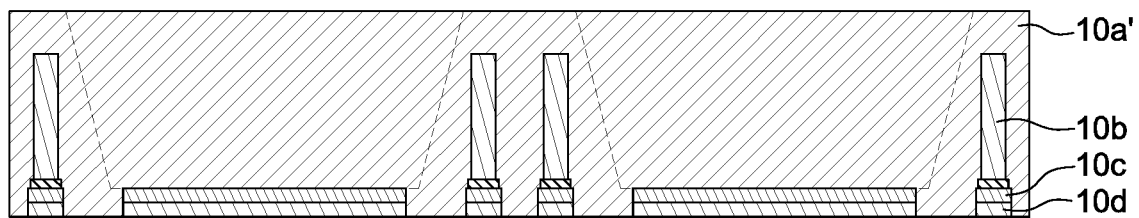
FIG. 7B illustrates a method of manufacturing a semiconductor device package according to some embodiments of the present disclosure.

Referring to FIG. 7B, the conductive post 10b, the conductive layer 10c, the patterned conductive layer 10d are molded with an encapsulant 10'a to form a carrier during a molding operation. A post curing operation is subsequently performed. Then, a deflash operation is performed. The encapsulant 10'a encapsulates the conductive post 10b, the conductive layer 10c, the patterned conductive layer 10d. The conductive layer 10c may be partially exposed by the encapsulant 10'a. The shape of the encapsulant 10'a may be set according to design specifications.

Figure 7C:
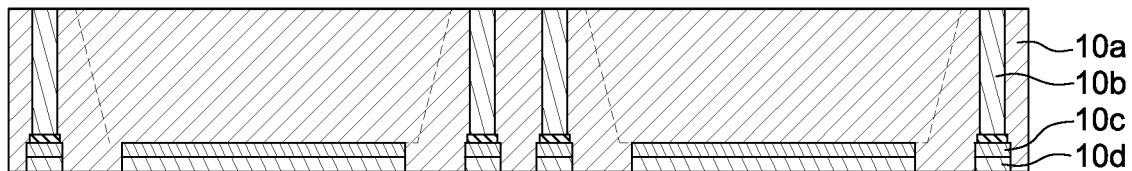
FIG. 7C illustrates a method of manufacturing a semiconductor device package according to some embodiments of the present disclosure.

Referring to FIG. 7C, the encapsulant 10'a is grinded by a grinding operation to expose an upper surface of the conductive post 10b. In the other embodiments, the upper surface of the conductive post 10b is exposed by forming an opening within the encapsulant 10'a by laser drilling.

Figure 7D:
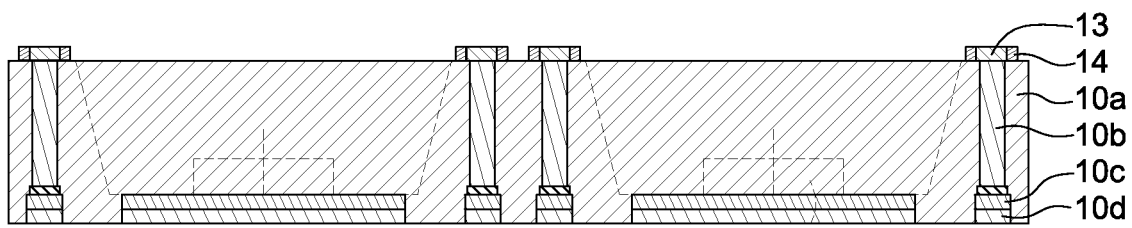
FIG. 7D illustrates a method of manufacturing a semiconductor device package according to some embodiments of the present disclosure.

Referring to FIG. 7D, a semiconductor device 11 is disposed on the conductive layer 10c. The semiconductor device 11 is disposed in an accommodating space defined by the encapsulant 10a. The semiconductor device 11 is wire-bonded to the conductive layer 10c. The semiconductor device 11 is electrically connected to the conductive layer 10c. The semiconductor device 11 is surrounded by the encapsulant 10a.

Subsequently, a conductive element 13 is disposed on the encapsulant 10a. The conductive element 13 contacts the upper surface of the conductive post 10b. The conductive element 13 is electrically connected to the patterned conductive layer 10d through the conductive post 10b. An adhesive layer 14 is disposed on the encapsulant 10a. The adhesive layer 14 is adjacent to the conductive element 13. The adhesive layer 14 contacts the conductive element 13. The adhesive layer 14 surrounds the conductive element 13. The adhesive layer 14 may partially cover the conductive element 13 during a glue dispensing operation (e.g. may exhibit a gel-bleeding effect). A material of the adhesive layer 14 may be the same as the material of the conductive element 13. The material of the adhesive layer 14 may be different from the material of the conductive element 13. A size (e.g. a length, a width, and/or a thickness) of the adhesive layer 14 may be set according to design specifications. The arrangement of the adhesive layer 14 may be set according to design specifications.

Optionally, an adhesive layer 15 is disposed on the encapsulant 10a (not denoted in FIG. 7D). The adhesive layer 15 may be adjacent to the adhesive layer 14. The arrangement of the adhesive layer 15 may be set according to design specifications. The adhesive layer 15 may be spaced from the adhesive layer 14. The adhesive layer 15 may contact the adhesive layer 14. A size (e.g. a length, a width, and/or a thickness) of the adhesive layer 15 may be set according to design specifications. The adhesive layer 15 may have a greater adhesive strength than the adhesive layer 14 (e.g. by a factor of about 1.1 or more, about 1.2 or more, or about 1.3 or more). The adhesive layer 15 is disposed on the encapsulant 10a and surrounds the adhesive layer 14.

Figure 7E:
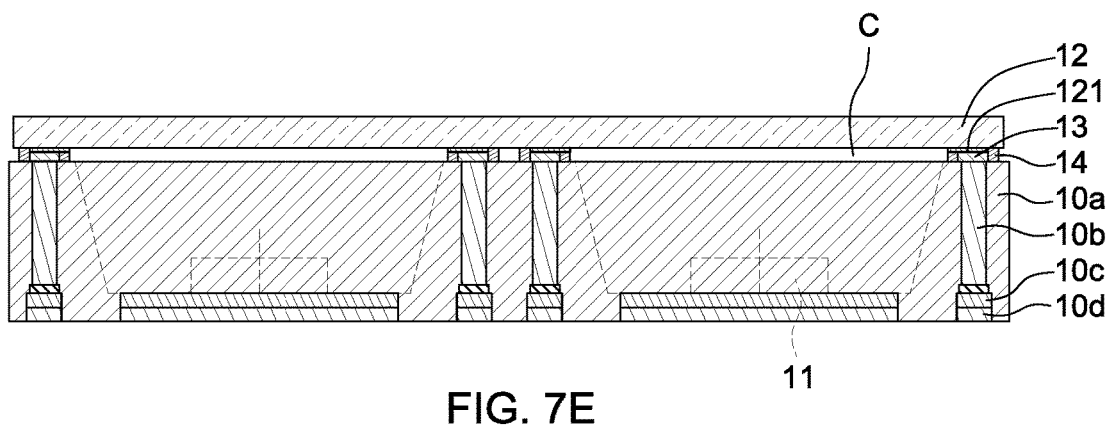
FIG. 7E illustrates a method of manufacturing a semiconductor device package according to some embodiments of the present disclosure.

Referring to FIG. 7E, a lid 12 is disposed on the encapsulant 10a of the carrier. The lid 12 is disposed over the carrier and the semiconductor device 11. The lid 12 covers the semiconductor device 11. A patterned conductive layer (or conductive trace) 121 is disposed on a lower surface of the lid 12. The patterned conductive layer 121 is surrounded by the adhesive layer 14. The patterned conductive layer 121 is covered by the adhesive layer 14. The lid 12 is secured to the carrier through the conductive element 13, the adhesive layer 14, and the adhesive layer 15. A bonding force of the adhesive layer 15 between the carrier and the lid 12 may be greater than a bonding force of the adhesive layer 14 between the carrier and the lid 12 (e.g. by a factor of about 1.1 or more, about 1.2 or more, or about 1.3 or more).

The lid 12, the conductive element 13, and the carrier 10 define a channel in fluid/air communication with the accommodating space.

Figure 7F:
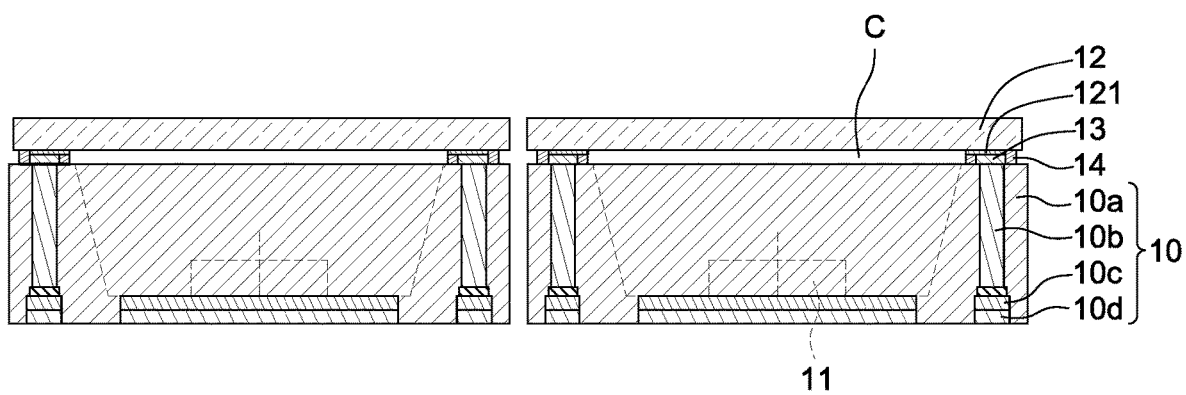
FIG. 7F illustrates a method of manufacturing a semiconductor device package according to some embodiments of the present disclosure.

Referring to FIG. 7F, a singulation operation is performed to form the semiconductor device package 1". In some embodiments, a panel of semiconductor device packages 1" is singulated by a singulation operation. A strip sheet of semiconductor device packages 1" may be singulated by a singulation operation.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device package, comprising:
a carrier comprising a first patterned conductive layer and a second patterned conductive layer, the first patterned conductive layer being separated from the second patterned conductive layer;
a light source disposed on and electrically connected to the first patterned conductive layer of the carrier; and
a transparent lid disposed on the carrier and comprising a conductive trace on a bottom surface of the transparent lid, the transparent lid covering the light source and electrically connected to the second patterned conductive layer of the carrier;
a first conductive element overlapping the conductive trace along a perpendicular direction; and
a second conductive element overlapping the conductive trace along the perpendicular direction, the second conductive element electrically connected to the first conductive element through the conductive trace, wherein the first conductive element and the second conductive element are within a projection area of the transparent lid along the perpendicular direction; and
an encapsulant encapsulating the first conductive element and the second conductive element,
wherein the conductive trace is a non-closed loop, and
wherein the second patterned conductive layer of the carrier and the transparent lid constitute at least part of an electric circuit.

2. The semiconductor device package of claim 1, further comprising an adhesive layer disposed on the carrier and extending along one side of the carrier.

\* \* \* \* \*